(12) United States Patent
Nakagawa et al.

(10) Patent No.: US 7,648,907 B2
(45) Date of Patent: Jan. 19, 2010

(54) SEMICONDUCTOR DEVICE, WIRING SUBSTRATE FORMING METHOD, AND SUBSTRATE PROCESSING APPARATUS

(75) Inventors: Kanae Nakagawa, Kawasaki (JP);
Masataka Mizukoshi, Kawasaki (JP);
Kazuo Teshirogi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 404 days.

(21) Appl. No.: 11/727,004

(22) Filed: Mar. 23, 2007

(65) Prior Publication Data

US 2007/0287282 A1 Dec. 13, 2007

Related U.S. Application Data

(60) Division of application No. 11/097,937, filed on Apr. 1, 2005, now Pat. No. 7,485,962, which is a continuation of application No. PCT/JP03/015808, filed on Dec. 10, 2003.

(30) Foreign Application Priority Data

Dec. 10, 2002 (JP) .............................. 2002-358536
May 22, 2003 (WO) ....................... PCT/JP03/06382

(51) Int. Cl.
*H01L 23/48* (2006.01)
(52) U.S. Cl. ...................... 438/622; 438/108
(58) Field of Classification Search ................ 438/622, 438/629, 677, 108, 110, 458, 667
See application file for complete search history.

(56) References Cited

U.S. PATENT DOCUMENTS 5,811,877 A 9/1998 Miyano et al.

(Continued)

FOREIGN PATENT DOCUMENTS

CN 1216398 A 5/1999

(Continued)

OTHER PUBLICATIONS

Patent Abstracts of Japan, Publication No. 09082616A, published on Mar. 28, 1997.

(Continued)

*Primary Examiner*—Roy K Potter
(74) *Attorney, Agent, or Firm*—Westerman, Hattori, Daniels & Adrian, LLP.

(57) ABSTRACT

A substrate support (201) having a flat supporting surface (201a) is prepared, and a semiconductor substrate (1) is fixed to the substrate supporting surface (201) by attaching a wiring forming surface (1a) to the supporting surface (201a) by suction, for example, by vacuum suction. On this occasion, the wiring forming surface (1a) is forcibly flattened by being attached to the supporting surface (201a) by suction, and therefore the wiring forming surface (1a) becomes a reference plane for planarization of a back surface (1b). In this state, planarization processing is performed by mechanically grinding the back surface (1b) to grind away projecting portions (12) of the back surface (1b). Hence, variations in the thickness of the substrate (especially, semiconductor substrate) are made uniform, and high-speed planarization is realized easily and inexpensively without disadvantages such as dishing and without any limitation on a wiring design.

12 Claims, 26 Drawing Sheets

U.S. PATENT DOCUMENTS

| | | | |
|---|---|---|---|
| 5,904,557 A | 5/1999 | Komiya et al. | |
| 6,194,317 B1 | 2/2001 | Kaisaki et al. | |
| 6,205,658 B1 | 3/2001 | Kawano | |
| 6,277,008 B1 | 8/2001 | Masuta et al. | |
| 6,396,146 B2 | 5/2002 | Nakayama | |
| 6,428,393 B1 | 8/2002 | Yukawa et al. | |
| 6,828,163 B2 | 12/2004 | Kobayashi et al. | |
| 7,247,524 B2 * | 7/2007 | Nakagawa | 438/118 |
| 2002/0000663 A1 | 1/2002 | Nakayama | |

FOREIGN PATENT DOCUMENTS

| | | |
|---|---|---|
| EP | 0913863 A2 | 5/1999 |
| EP | 1 261 020 A1 | 11/2002 |
| JP | 7-100737 | 4/1995 |
| JP | 7-326614 | 12/1995 |
| JP | 9-213699 A | 8/1997 |
| JP | 9-248758 | 9/1997 |
| JP | 10-337650 A | 12/1998 |
| JP | 11-154675 A | 6/1999 |
| JP | 11-163103 A | 6/1999 |
| JP | 11-291162 A | 10/1999 |
| JP | 2000-133623 | 5/2000 |
| JP | 2000-164595 A | 6/2000 |
| JP | 2000-196243 | 7/2000 |
| JP | 2000-266506 A | 9/2000 |
| JP | 2001-232555 | 8/2001 |
| JP | 2002-176013 | 6/2002 |
| JP | 2002-176016 A | 6/2002 |
| WO | WO 02/41380 A1 | 5/2002 |

OTHER PUBLICATIONS

Patent Abstracts of Japan, Publication No. 2000173954A, published on Jun. 23, 2000.
Patent Abstracts of Japan, Publication No. 08011049A, published on Jan. 16, 1996.
Patent Abstracts of Japan, Publication No. 2001203466A, published on Jul. 27, 2001.
Patent Abstracts of Japan, Publication No. 2001110717A, published on Apr. 20, 2001.
Chinese Office Action dated Jul. 6, 2007 issued in corresponding Application No. 20030102282.6.
Japanese Office Action dated Aug. 26, 2008 issued in corresponding Application No. 2005-502368.
Japanese Office Action dated Jul. 14, 2009 issued in corresponding Japanese patent Application No. 2005-502368 (w/Partial Translation).

* cited by examiner

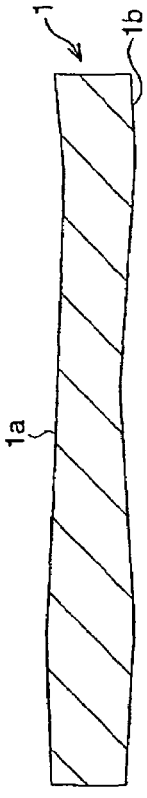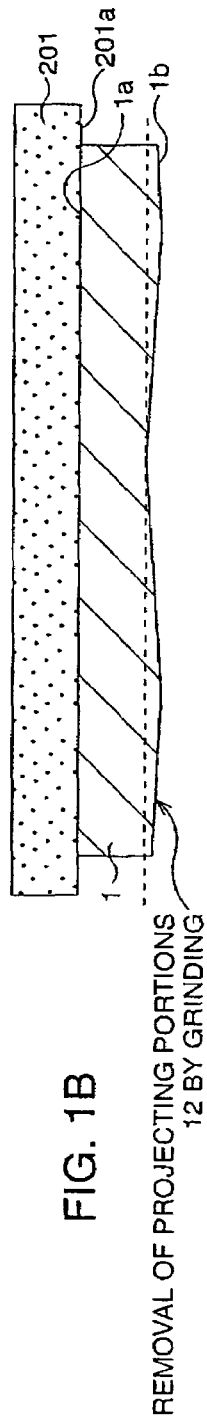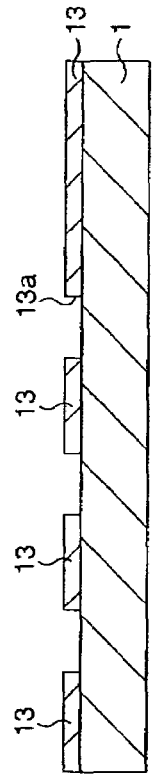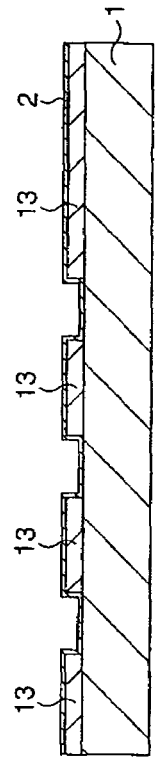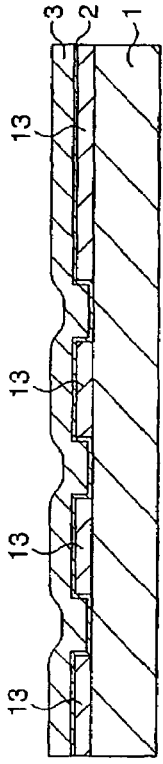
FIG. 1A
FIG. 1B
FIG. 1C
FIG. 1D
FIG. 1E

M
105
103

106

104

114
102

103

REMOVAL OF PROJECTING PORTIONS 12 BY GRINDING

SEMICONDUCTOR DEVICE, WIRING SUBSTRATE FORMING METHOD, AND SUBSTRATE PROCESSING APPARATUS

CROSS-REFERENCE TO RELATED APPLICATIONS

This application is the division of U.S. application Ser. No. 11/097,937 filed on Apr. 1, 2005, which is a continuation of PCT/JP03/15808 filed on Dec. 10, 2003 and claims the benefit of priority from the prior Japanese Patent Application No. 2002-358536, filed on Dec. 10, 2002, and PCT International Application No. PCT/JP03/06382, filed on May 22, 2003, the entire contents of which are incorporated herein by reference.

TECHNICAL FIELD

The present invention relates to a method of forming a multilayer wiring with an electronic device such as an LSI on a substrate, especially a semiconductor substrate, further a method of forming a multilayer wiring film by forming a multilayer wiring layer on a supporting base made of a metal material or an insulating material and removing the supporting base, a semiconductor device having a multilayer wiring, and a substrate processing apparatus.

BACKGROUND ART

Recently, with an increase in a demand for further miniaturization/high-density integration, multilayer wiring formation becomes necessary, and therefore advanced planarization technology is required. This planarization technology is mainly applied to a semiconductor substrate represented by a silicon wafer, and further to a film-shaped multilayer wiring thin film which recently attracts attention and, for example, seems promising for application to SiP (silicon in Package).

Conventionally, a CMP (Chemical Mechanical Polishing) method has been mainly adopted as a method of planarizing an insulating layer or a wiring layer formed on a silicon semiconductor substrate. In this method, the insulating layer or the wiring layer as a surface to be processed is formed relatively flatly in advance, and its surface is finely and flatly processed chemically/mechanically with slurry (chemical polishing agent) while a flat polishing pad is pressed thereon. A hard insulating material surface or metal surface which is provided in advance functions as a stop layer, and CMP is finished. CMP is a method which is independent of variations in semiconductor substrate thickness and TTV (Total Thickness Variation) defined as a difference between a maximum thickness and a minimum thickness.

In addition to the CMP method, several planarization methods, for example, using a cutting tool are thought out (See Patent Documents 1, 2, 3, and 4, for example). However, they are directed to planarization of an SOG film of a partial region on an LSI, and similarly to CMP, they are methods in which cutting is performed with a surface to be cut as a reference and independent of TTV of the semiconductor substrate.

On the other hand, it is thought that in a mounting substrate required to realize SiP, only a thin film wiring layer is used as an interposer to form the mounting substrate inexpensively and simply. Conventionally, a thin-film multilayer wiring substrate without any through-hole formed by preparing plural resin films, in each of which via holes filled with a conductive paste and wirings are formed, and stacking them collectively in a final process is developed. This wiring substrate can be realized at low cost, but scaling down is difficult since the via diameter is approximately between 120 μm and 200 μm, L/S (Line/Space) is approximately between 100 μm/100 μm and 200 μm/200 μm. Hence, to realize both scaling down and low cost, it is effective to separate a multilayer wiring thin film formed on the substrate and make it of a substrate.

Fine planarization can be realized if the CMP method is used, but its process requires a high manufacturing cost since a processing apparatus is expensive and throughput is low. When a metal such as copper and an insulator are planarized at the same time, a hollow called dishing sometimes occurs in a portion where a pattern is sparse. From the need for avoiding this occurrence of dishing, the size of a wiring pattern in an LSI or the like is restricted, so that such an arrangement that a blank portion of the pattern is not formed is required.

On the other hand, for the aforementioned formation of the multilayer wiring thin film, it is necessary to first form the multilayer wiring thin film on a supporting base and strip off or remove the supporting base. As a method of stripping it off, there is a method of coating only a peripheral portion of the substrate with an adhesion improving material using the fact that the adhesiveness between an insulating resin of the multilayer wiring thin film and the supporting base is low and separating the portion coated with the adhesion improving material and a portion uncoated therewith after the formation of a wiring layer is completed to thereby separate the multilayer wiring thin film from the supporting base. This stripping method is, so to speak, the image of stripping off a film, and has a possibility of causing damage to a circuit. On the other hand, the method of removing the supporting base is a method of, for example, if the supporting base is a semiconductor substrate, removing it by grinding and etching. Moreover, if a metal plate made of Al or Cu is the supporting base, it is removed by etching.

Even if either of these methods is adopted, the supporting base itself is reflected in cost, in addition, if the supporting base is a semiconductor substrate in the latter method, a residue after grinding all becomes rubbish, and an enormous amount of rubbish is produced through the process, so that a bad influence on the environment cannot be ignored.

(Patent Document 1) Japanese Patent Application Laid-open No. Hei 7-326614

(Patent Document 2) Japanese Patent Application Laid-open No. Hei 8-11049

(Patent Document 3) Japanese Patent Application Laid-open No. Hei 9-82616

(Patent Document 4) Japanese Patent Application Laid-open No. 2000-173954

SUMMARY OF THE INVENTION

The present invention is made in view of the aforementioned problems, and considering that it is mainly directed to machining other than CMP represented as a planarization method, variations in the thickness of a substrate (especially, a semiconductor substrate and a conductor/insulating substrate) are made uniform, and high-speed planarization is realized easily and inexpensively without disadvantages such as dishing and without any limitation on a wiring design. Moreover, an object of the present invention is to provide a wiring substrate forming method and a semiconductor device, and a substrate processing apparatus capable of, when a multilayer wiring thin film is obtained as a single body by finally removing the substrate, easily performing fine control of thicknesses of respective wiring layers composing the multilayer wiring thin film and removing the substrate efficiently at low cost to realize the wiring thin film having a fine wiring structure.

A wiring substrate forming method of the present invention is a method of forming a wiring on a substrate including the steps of: with a wiring forming surface of the substrate as a reference, subjecting a back surface of the wiring forming surface to planarization processing by first machining; forming the wiring and an insulating film which covers the wiring on the wiring forming surface; and performing planarization processing by second machining with the back surface as a reference in such a manner that a surface of the wiring and a surface of the insulating film become continuously flat.

A wiring substrate forming method of the present invention includes the steps of: making a thickness of a supporting base uniform by first machining; forming a wiring and an insulating film which covers the wiring on a front surface of the supporting base whose thickness is made uniform; performing planarization processing by second machining in such a manner that a surface of the wiring and a surface of the insulating film become continuously flat to form a wiring layer composed of the wiring and the insulating film; and forming a wiring thin film having a uniform thickness which includes the wiring layer by removing the supporting base.

A semiconductor device of the present invention is a semiconductor device including: a semiconductor substrate; a semiconductor element formed on a front surface of the semiconductor substrate; and a multilayer wiring formed by stacking respective wirings in plural layers in an insulator, wherein machining is performed on a side of a back surface of the front surface, on which the semiconductor element is formed, with the front surface as a reference to planarize the back surface and make substrate thickness uniform.

A substrate processing apparatus of the present invention is a substrate processing apparatus when a wiring is formed on a substrate, including: a substrate support which has a flat supporting surface and fixedly supports the substrate by attaching its one surface to the supporting surface by suction, forcibly using the one surface as a flat reference plane; and a tool which subjects the other surface of the substrate fixedly supported by the substrate support to cutting, wherein planarization processing is performed in such a manner that a surface of the wiring and a surface of an insulating film become continuously flat by subjecting the other surface of the substrate to cutting by the tool.

BRIEF DESCRIPTION OF THE DRAWINGS

FIG. 1A to FIG. 1E are schematic sectional views showing a multilayer wiring substrate forming method according to a first embodiment step by step;

DETAILED DESCRIPTION OF THE PREFERRED EMBODIMENTS

-Basic Gist of the Present Invention-

Figure 2A:
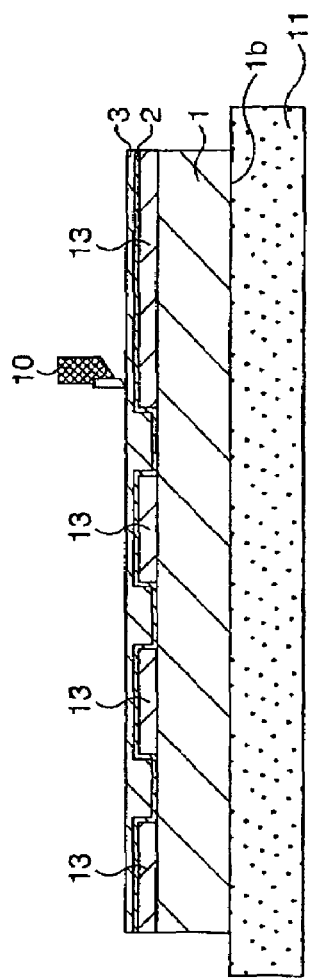
FIG. 2A to FIG. 2C are schematic sectional views showing the multilayer wiring substrate forming method according to the first embodiment step by step.

First, the basic gist of the present invention will be described.

It is premised that the present invention is mainly directed to machining other than CMP which is represented, for example, by cutting with a tool as a planarization method. Metals such as copper, aluminum, and nickel and an insulating material such as polyimide are materials which are easily cut by the tool. Wirings and an insulating film which are made of these materials on a semiconductor substrate can be planarized easily and at high speed by cutting. Moreover, no dishing occurs in cutting.

The problem when cutting is used for planarizing a semiconductor substrate represented by a silicon wafer is that cutting is performed with a rear surface (back surface) of the substrate as a reference. Generally, the TTV of a silicon substrate is within a range from 1 µm to 5 µm, and in an LSI process, a TTV of approximately 5 µm does not exert any influence on photolithography, and therefore it is usually excepted from consideration. However, cutting is greatly influenced by the value of TTV. The flatness accuracy by cutting never reaches the value of TTV or less. Accordingly, when cutting is used for planarizing the semiconductor substrate, it is necessary first of all to control the TTV of the substrate at a target cutting accuracy or less.

In view of the aforementioned circumstances, the present inventor comes up with the idea of, before forming wirings and an insulating film, first grinding a back surface with a front surface which becomes a wiring forming surface as a reference to keep the TTV of a semiconductor substrate low at a target cutting accuracy or less. In this case, it is ideal to reduce the TTV and keep variations in the thickness of each individual semiconductor substrate at the cutting accuracy or less. However, if only the TTV can be reduced, the thickness of each semiconductor substrate can be detected at the time of cutting. The amount of cutting can be controlled by this detection of the thickness of each semiconductor substrate.

Moreover, in the present invention, the aforementioned cutting technology is applied to the formation of a film-shaped multilayer wiring thin film. Namely, it is used for a case where after wiring layers are stacked on a supporting base made of an insulating material or a conductive material to form a multilayer wiring thin film, the supporting base is removed, and only the multilayer wiring thin film can be used as an interposer. In this case, a metal plate or an insulating plate is used as the supporting base, whereby a planarization (uniformization of thickness) process of the supporting base as a preceding process to form a wiring layer can be performed by cutting. Then, a planarization processing at the time of formation of respective wiring layers can be performed by cutting, and further also in a supporting base removing process, the supporting base can be removed by cutting. As just described, all of the planarization of the supporting base, planarization at the time of formation of respective wiring layers, and successive cutting of the supporting base can be performed by cutting with a tool, which realizes high-precision planarization of the respective wiring layers and removal of the base easily and at high speed.

Further, if the supporting base is the insulating plate, it becomes possible to, using easy, high-speed, and high-precision planarization controllability of cutting, planarize the supporting base leaving only any given thickness and use this left supporting base as an insulating layer. Furthermore, if the supporting base is the metal plate, it becomes possible to collect chippings produced by cutting and reuse them for the formation of the supporting base.

Specific Embodiments

Based on the aforementioned basic gist, specific embodiments of the present invention will be described below using the drawings.

First Embodiment

Here, a silicon semiconductor substrate (silicon wafer) is shown as an example of a substrate, and a case where a multilayer wiring formed by staking wirings in plural layers in an insulator is formed on the semiconductor substrate is disclosed.

FIG. 1A to FIG. 1E, FIG. 2A to FIG. 2C, FIG. 3A to FIG. 3C, and FIG. 4A to FIG. 4C are schematic sectional views showing a multilayer wiring substrate forming method according to this embodiment step by step.

First, as shown in FIG. 1A, a silicon semiconductor substrate 1 is prepared. Usually, the silicon semiconductor substrate is not uniform in thickness as shown and besides has undulations.

Hence, as a preceding process to subject one principal surface of the semiconductor substrate 1, here a substrate front surface (wiring forming surface 1a), to cutting with a tool which will be described later, the other principal surface of the semiconductor substrate 1, here a back surface 1b (of the wiring forming surface 1a), is planarized.

More specifically, as shown in FIG. 1B, a substrate support 201 having a flat supporting surface 201a is prepared, and the semiconductor substrate 1 is fixed to the substrate support 201 by attaching the wiring forming surface 1a to the supporting surface 201a by suction, for example, by vacuum suction. On this occasion, the wiring forming surface 1a is forcibly flattened by being attached to the supporting surface 201a by suction, and therefore the wiring forming surface 1a becomes a reference plane for planarization of the back surface 1b. In this state, planarization processing is performed by subjecting the back surface 1b to machining, here grinding, to grind away projecting portions 12 of the back surface 1b. In this case, it is desirable to control the amount of cutting of the back surface 1b according to a distance from the wiring forming surface 1a. Hence, control is performed in such a manner that the thickness of the semiconductor substrate 1 becomes uniform, more specifically, the TTV (difference between a maximum thickness and a minimum thickness of the substrate) becomes a predetermined value or less, and still more specifically, the TTV becomes 1 µm or less.

Then, as shown in FIG. 1C, the semiconductor substrate 1 is detached from the substrate support 201, a photosensitive resin, for example, a photosensitive polyimide 13 is applied onto the wiring forming surface 1a of the semiconductor substrate 1, and this photosensitive polyimide 13 is processed by photolithography to form a predetermined electrode pattern 13a.

Thereafter, as shown in FIG. 1D, a metal, for example, a copper film is formed on the wiring forming surface 1a in such a manner as to cover the photosensitive polyimide 13, for example, by a sputtering method to thereby form a seed layer 2.

Subsequently, as shown in FIG. 1E, with the seed layer 2 as an electrode, copper is deposited so as to have such a thickness that the photosensitive polyimide 13 is embedded therein by a plating method to thereby form a ground (GND) electrode 3.

Then, the wiring forming surface 1a is subjected to cutting with a tool to be planarized.

More specifically, as shown in FIG. 2A, the semiconductor substrate 1 is fixed to the substrate support 11 by attaching the back surface 1b of the semiconductor substrate 1 to a supporting surface 11a of a substrate support 11, for example, by vacuum suction. On this occasion, the semiconductor substrate 1 is made uniform in thickness by the planarization processing in FIG. 1B and undulations and the like are forcibly eliminated by the attachment by suction in FIG. 2A, whereby the back surface 1b becomes a reference plane for planarization of the wiring forming surface 1a. In this state, a surface layer of the GND electrode 3 on the wiring forming surface 1a is subjected to machining, here cutting with a tool 10 made of diamond or the like and thereby planarized.

Figure 2B:
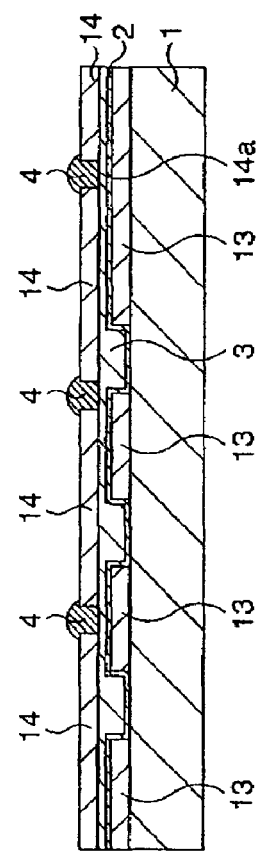

Thereafter, as shown in FIG. 2B, a photoresist 14 is applied onto the planarized GND electrode 3, and by processing the photoresist 14 by photolithography, a predetermined via pattern 14a is formed. Then, via portions 4 are formed by embedding copper or the like in openings of the via pattern 14a by the plating method.

Figure 2C:
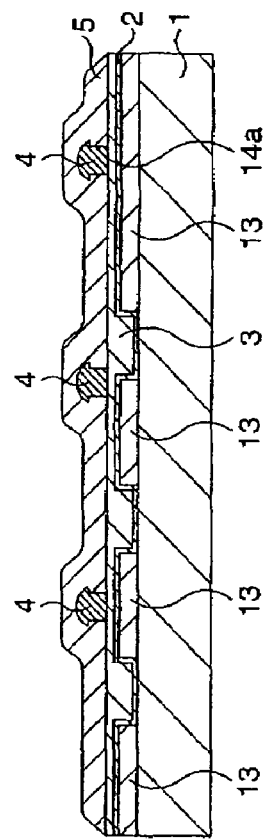

Subsequently, as shown in FIG. 2C, for example, after the photoresist 14 is stripped off, an insulating resin 5 is formed on the wiring forming surface 1a in such a manner as to cover and fill up the via portions 4.

Then, the wiring forming surface 1a is subjected again to cutting with the tool and planarized.

Figure 3A:
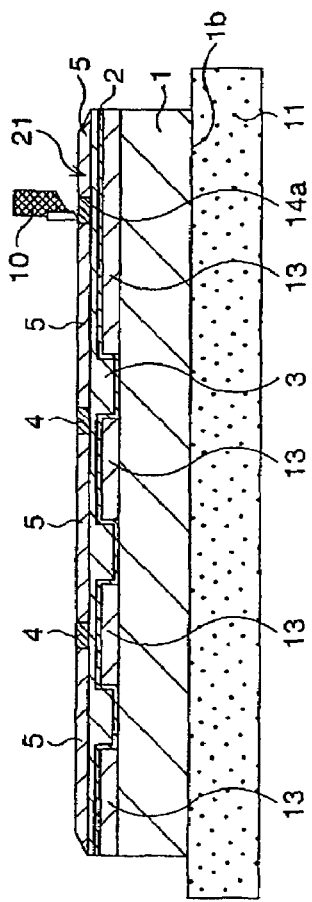
FIG. 3A to FIG. 3C are schematic sectional views showing the multilayer wiring substrate forming method according to the first embodiment step by step.

More specifically, as shown in FIG. 3A, the semiconductor substrate 1 is fixed to the substrate support 11 by attaching the back surface 1b to the supporting surface 11a of the substrate support 11, for example, by vacuum suction. On this occasion, similarly to the above, the back surface 1b becomes a reference plane for the planarization of the wiring forming surface 1a. In this state, surface layers of the via portions 5 and the insulating resin 5 on the wiring forming surface 1a are planarized by being subjected to machining, here cutting with the tool 10 while the semiconductor substrate 1 is being rotated at a rotation speed approximately between 800 rpm and 1600 rpm. As a result of this planarization processing, a via layer 21 having a uniform thickness from which upper surfaces of the via portions 4 are exposed and in which the via portions 4 are embedded in the insulating resin 5 is formed.

Figure 3B:
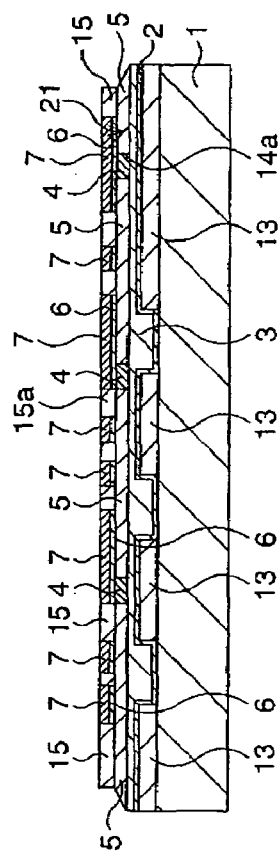

Thereafter, as shown in FIG. 3B, after a copper film is deposited on surfaces of the planarized via portions 4 and insulating resin 5 by the sputtering method to form a seed layer 6, a first photoresist 15 is applied, and by processing this first photoresist 5 by photolithography, a predetermined wiring pattern 15a is formed. Then, with the seed layer 6 as an electrode, the wiring pattern 15a portion of the first photoresist 5 is filled by the plating method to form wirings 7.

Figure 3C:
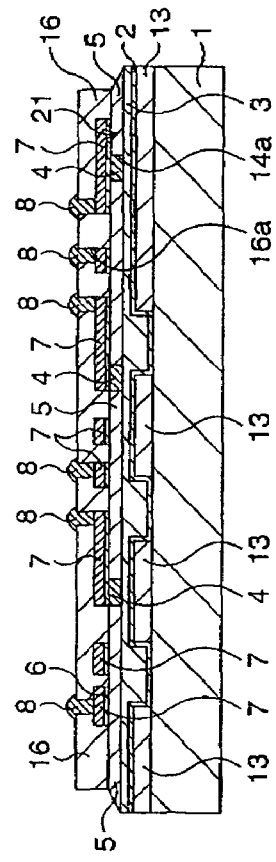

Subsequently, as shown in FIG. 3C, after the first photoresist 15 is removed, for example, using an alkaline stripping solution, a second photoresist 16 is applied onto the wirings 7 so as to fill up them, and by processing this second photoresist 16 by photolithography, a predetermined via pattern 16a is formed. Copper or the like is embedded in the via pattern 16a by the plating method to form via portions 8.

Figure 4A:
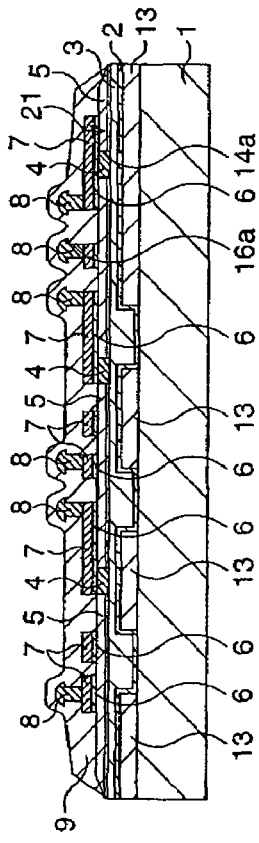
FIG. 4A to FIG. 4C are schematic sectional views showing the multilayer wiring substrate forming method according to the first embodiment step by step.

Then, as shown in FIG. 4A, after the second photoresist 16 and the seed layer 6 are removed, for example, by the alkaline stripping solution, an insulating resin 9 is formed on the wiring forming surface 1a so as to cover and fill up the wirings 7 and the via portions 8.

Thereafter, the wiring forming surface 1a is subjected again to cutting with the tool to be planarized.

Figure 4B:
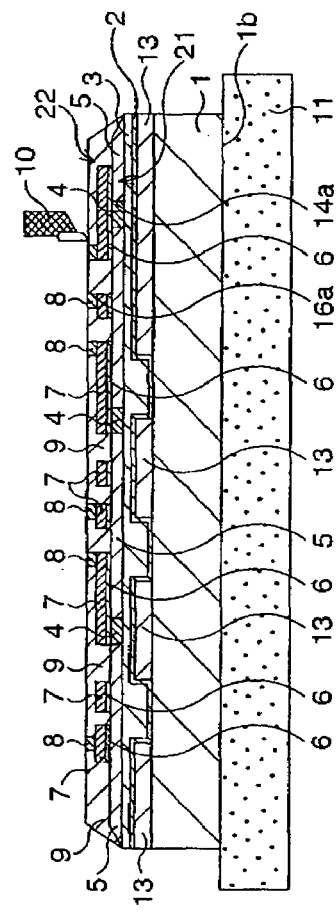

More specifically, as shown in FIG. 4B, the semiconductor substrate 1 is fixed to the substrate support 11 by attaching the back surface 1b to the supporting surface 11a of the substrate support 11, for example, by vacuum suction. On this occasion, similarly to the above, the back surface 1b becomes a reference plane for the planarization of the wiring forming surface 1a. In this state, surface layers of the via portions 8 and the insulating resin 9 on the wiring forming surface 1a are planarized by being subjected to machining. Incidentally, here, cutting with the tool 10 as an example of the machining is performed. As a result of this planarization processing, a first wiring layer 22 whose thickness is made uniform in which the wirings 7 and the via portions 8 connected thereto are embedded in the insulating resin 9 so that upper surfaces of the via portions 8 are exposed therefrom is formed.

Figure 4C:
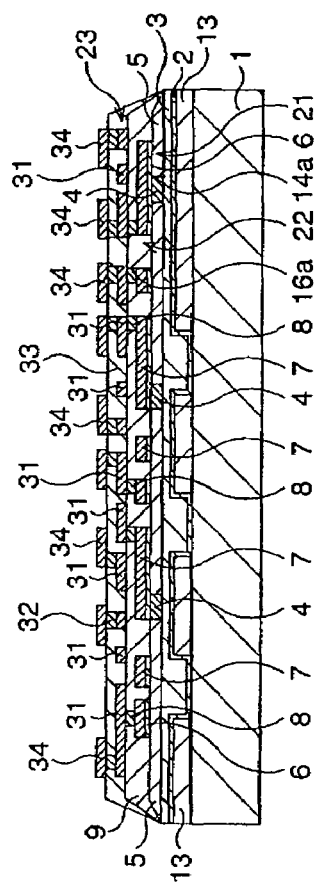

Then, as shown in FIG. 4C, in the same manner as the formation of the fist wiring layer 22, that is, by undergoing the same series of processes as in FIG. 3B, FIG. 3C, FIG. 4A, and FIG. 4B several times, a stacked structure in which wiring and via portions connected thereto are embedded in insulating resins is formed. A second wiring layer 23 whose thickness is made uniform and in which wirings 31 and via portions 32 connected thereto are embedded in an insulating resin 33 and wirings 34 formed on this second wiring layer 23 are shown as an example.

Thereafter, through the formation of a protective film (not shown) which covers the entire surface of the semiconductor substrate 1, a multilayer wiring structure is finished on the semiconductor substrate 1.

Incidentally, in this embodiment, an explanation is given regarding one semiconductor substrate, but it is also possible to perform respective processes of this embodiment on plural semiconductor substrates which compose a lot to make the thicknesses of respective semiconductor substrates uniform. Consequently, for example, it becomes possible to perform processing such as cutting on respective substrates in one and the same lot under the same condition.

Moreover, in each of the planarization processes in FIG. 2A, FIG. 3A, and FIG. 4B, correcting of parallelism of the semiconductor substrate 1 is performed with the back surface 1b as a reference, the position of the wiring forming surface 1a is detected, and the amount of cutting is calculated from the detected position of the wiring forming surface 1a to thereby control the tool 10.

Figure 5:
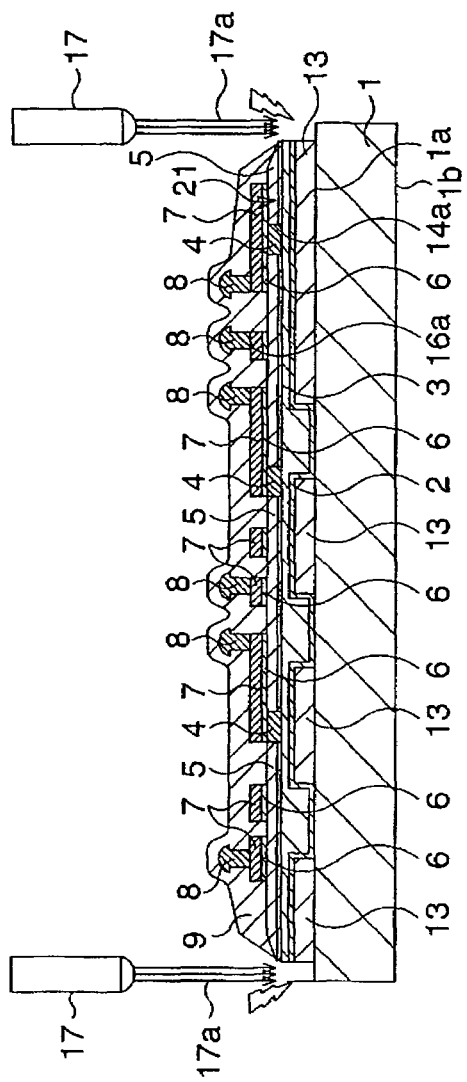
FIG. 5 is a schematic view showing a concrete example of respective planarization processes in FIG. 2A, FIG. 3A, and FIG. 4B.
Figure 5:
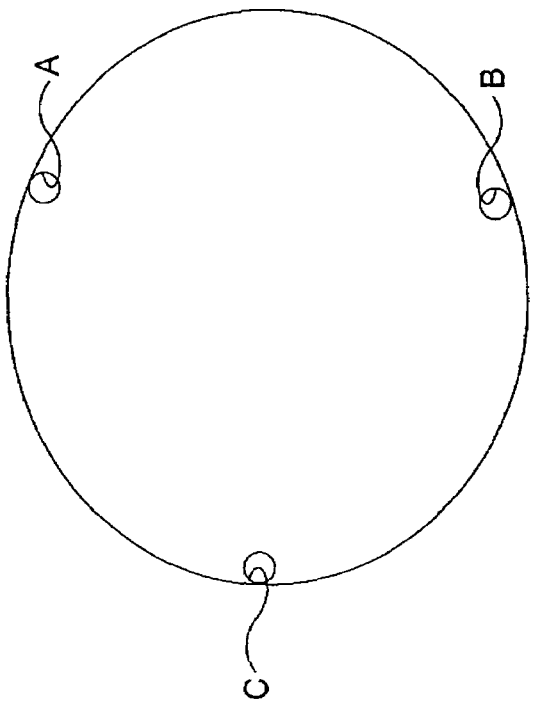

More specifically, the "correcting of parallelism" is performed, as shown in FIG. 5, by irradiating a laser beam 17a to the insulating resins 5 and 9 and the photosensitive polyimide 13 (the seed layer 2 in some cases) in plural points, for example, three points A, B, and C here of a peripheral portion of the wiring forming surface 1a when the position of the wiring forming surface 1a is detected using a laser beam irradiating unit 17, thereby scattering these resins and poyimide, and exposing a part of the wiring forming surface 1a.

Figure 6:
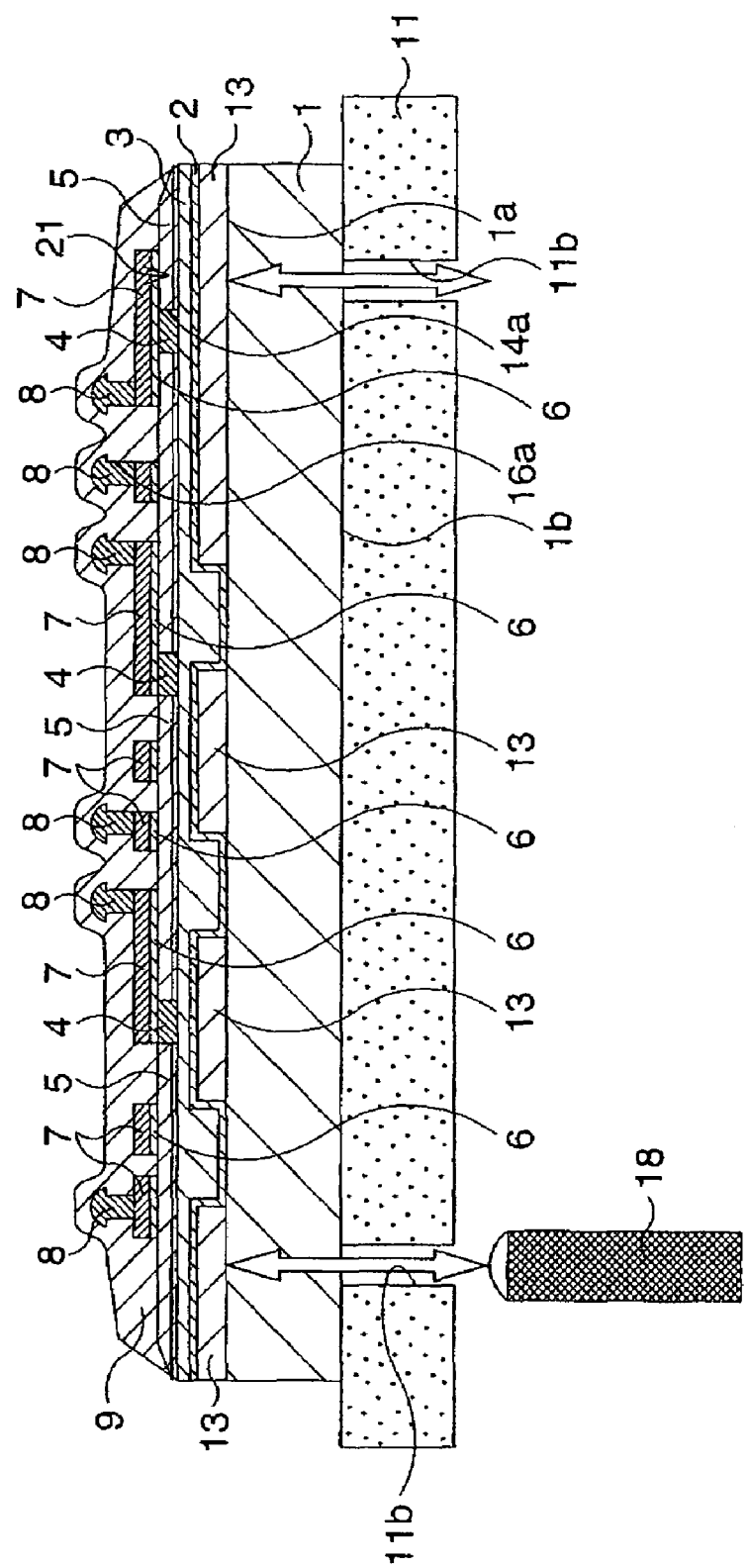
FIG. 6 is a schematic view showing another concrete example of the respective planarization processes in FIG. 2A, FIG. 3A, and FIG. 4B.

Further in this case, as shown in FIG. 6, it is also possible to, when the position of the wiring forming surface 1a is detected, fix the semiconductor substrate 1 to the substrate support 11, in which an opening 11b is formed, by suction, irradiate an infrared laser beam to the back surface 1b from the opening 11b using an infrared laser beam irradiator 18, and measure a reflected light from the wiring forming surface 1a using this infrared laser beam irradiator 18 (or a laser beam measuring device provided in the neighborhood thereof).

Figure 7:
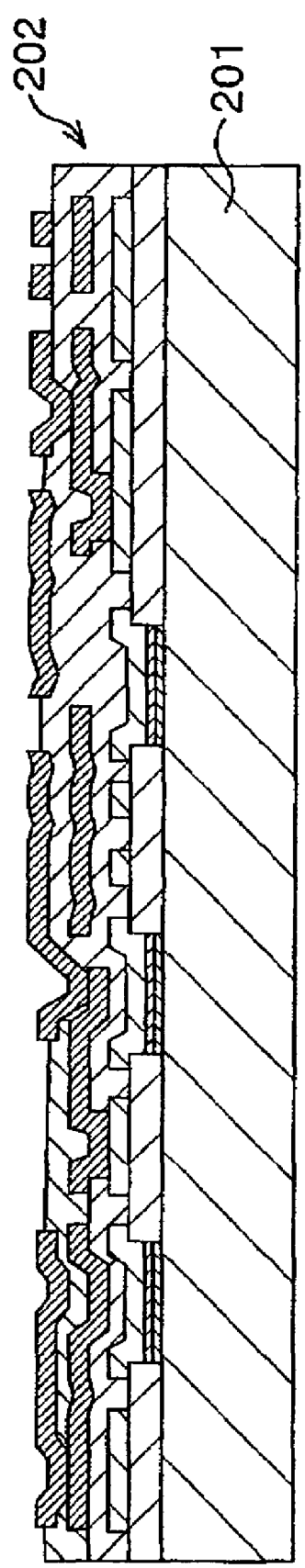
FIG. 7 is a schematic sectional view showing a comparative example of the first embodiment.

A comparative example of this embodiment is shown here in FIG. 7. In this comparative example, a case where a multilayer wiring structure 202 is formed on a semiconductor substrate 201 without performing the planarization processing of this embodiment is shown as an example. When the planarization processing is not performed as just described, irregularities in an upper surface become remarkable as the number of wiring layers increases, which hinders multilayer wiring formation.

As compared with this, in this embodiment, after the back surface 1b of the semiconductor substrate 1 is first subjected to planarization processing with the wiring forming surface 1a as a reference, based on this, the via layer 21 and the respective wiring layers 22 and 23 each having a uniform thickness are formed in sequence on the wiring forming surface 1a with the back surface 1b as a reference, and hence even if many wiring layers are further stacked, a fine wiring structure is realized without impairing flatness while the occurrence of irregularities is prevented.

As explained above, according to this embodiment, variations in the thickness of the semiconductor substrate 1 are made uniform, and disadvantages such as dishing do not occur. As a result, high-speed planarization becomes possible easily and inexpensively without any limitation on a wiring design. Moreover, a fine multilayer wiring structure can be realized easily and finely.

[Structure of Grinding Apparatus]

A specific device structure to execute the grinding process explained using FIG. 1B is explained here.

Figure 8A:
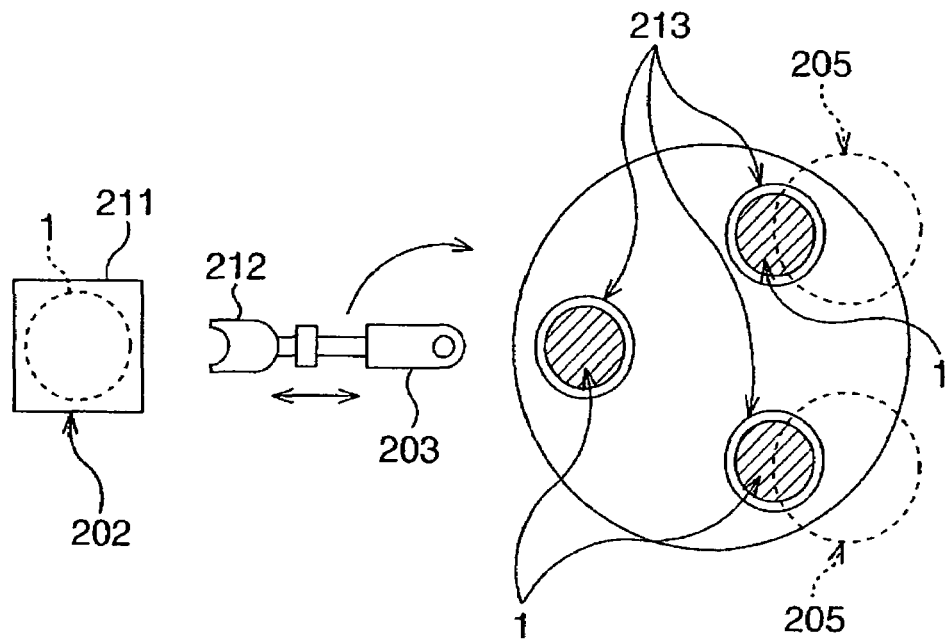
FIG. 8A and FIG. 8B are structural views of a grinding apparatus.
Figure 8B:
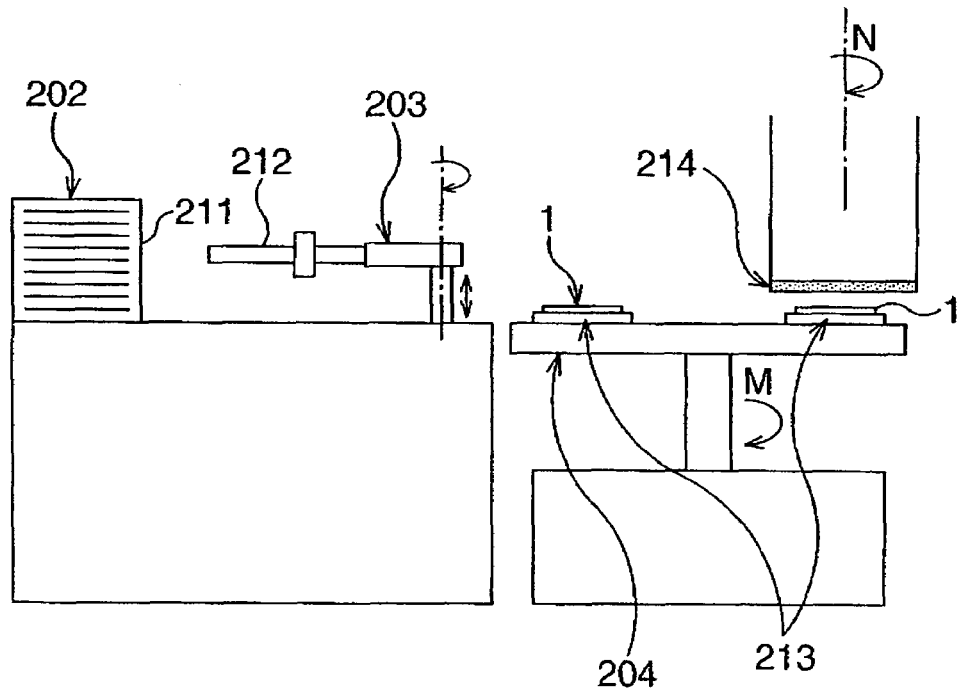

FIG. 8A and FIG. 8B show the structure of a grinding apparatus, FIG. 8A is a plan view, and FIG. 8B is a side view.

This grinding apparatus includes a housing section 202 to house the semiconductor substrate (semiconductor wafer) 1, a hand section 203 to transfer the semiconductor substrate 1 to respective processing sections, a turntable 204 on which the semiconductor substrate 1 is fixedly mounted at the time of grinding, and a grinder section 205 to grind the semiconductor substrate 1.

The housing section 202 includes a housing cassette 211 in which plural semiconductor substrates 1 are housed, and the respective semiconductor substrates 1 are housed as shown in FIG. 8B.

The hand section 203 includes a transfer hand 212, takes the semiconductor substrate 1 out of the housing cassette 211, transfers it to the turntable 204 in the example shown, and also transfers the processed semiconductor substrate 1 from the turntable 204 to the housing section 202.

The turntable 204 includes plural (three here) chuck tables 213 to chuck the semiconductor substrate on its front surface, and it is rotatable, for example, in a direction of an arrow M in FIG. 8B.

The grinder section 205 is provided with a detachable grindstone 214 on its lower surface, and grinds the front surface of the semiconductor substrate 1 chucked by the chuck table 213, for example, in a direction of an arrow N in FIG. 8B while the grindstone 214 is in contact with the front surface of the semiconductor substrate 1. Here, two kinds of grindstones, for example, different in roughness are prepared for the grindstone 214.

To perform grinding using this grinding apparatus, first, the semiconductor substrate 1 is taken out of the housing section 202 by the transfer hand 212 of the hand section 203 and fixedly mounted on the chuck table 213 of the turntable 204. Then, the grindstone 214 of the grinder section 205 is brought into contact with the front surface of the semiconductor substrate 1 and grinds the front surface. At this time, the front surface is first ground by a rough-grained grindstone, and thereafter ground by a fine-grained grindstone for finishing. Then, the semiconductor substrate 1 which has undergone finishing grinding is dismounted from the chuck table 213 and housed in the housing section 202 by the transfer hand 212.

[Structure of Cutting Apparatus]

A specific device structure to execute the cutting process explained using FIG. 2A, FIG. 3A, and FIG. 4B is explained here.

Figure 9:
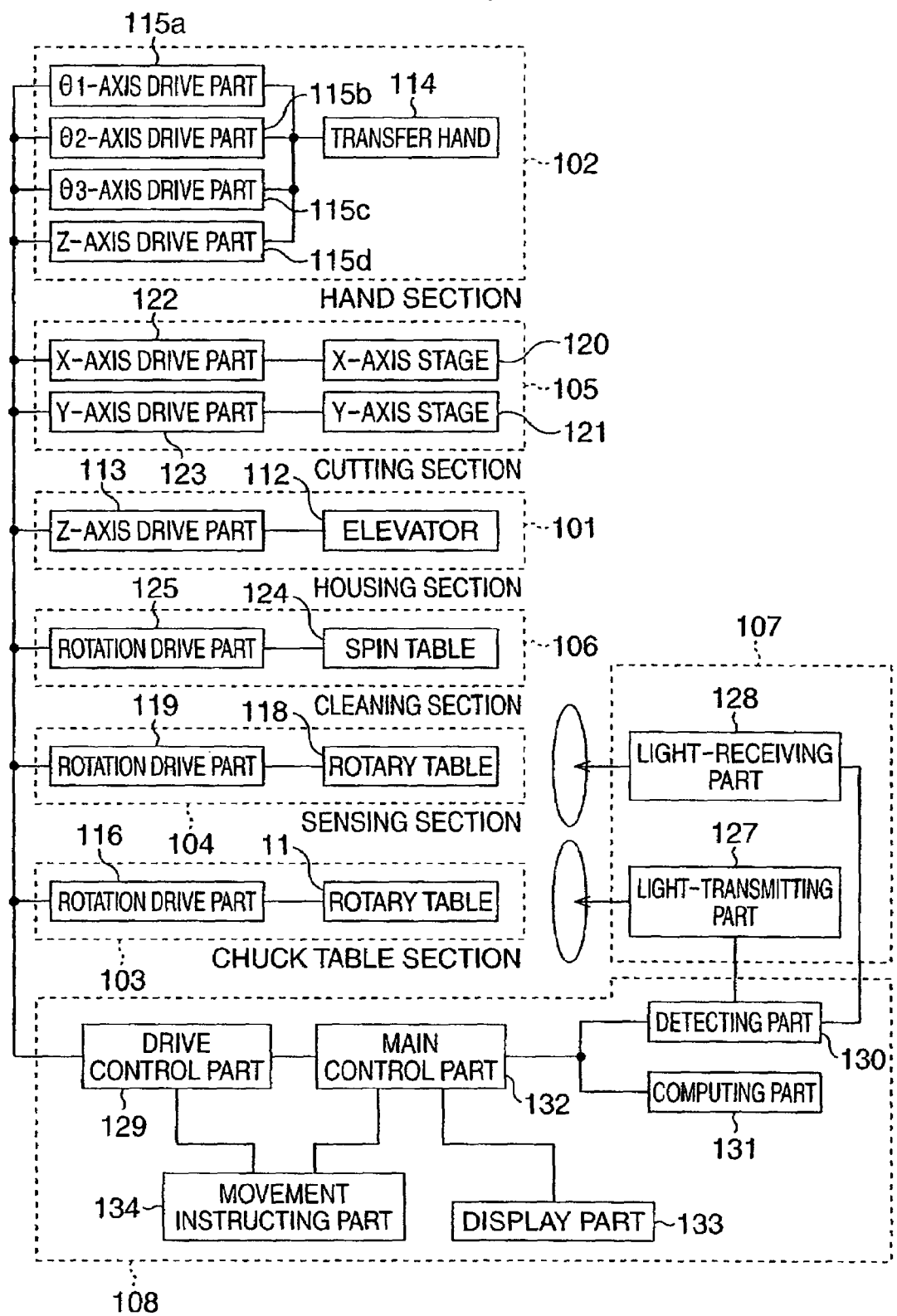
FIG. 9 is a block diagram showing the structure of a cutting apparatus.

FIG. 9 is a block diagram showing the structure of the cutting apparatus, and FIG. 10A to FIG. 10G are schematic structural views of the same.

This cutting apparatus includes a housing section 101 (FIG. 9, FIG. 10A) to house the semiconductor substrate (semiconductor wafer) 1 therein, a hand section 102 (FIG. 9, FIG. 10B, FIG. 10C) to transfer the semiconductor substrate 1 to the respective processing sections, a chuck table section 103 (FIG. 9, FIG. 10D) to chuck the semiconductor substrate 1 at the time of cutting, a sensing section 104 (FIG. 9, FIG. 10E) to perform positioning of the semiconductor substrate 1, a cutting section 105 (FIG. 9, FIG. 10F) to perform cutting for planarizing the semiconductor substrate 1, a cleaning section 106 (FIG. 9, FIG. 10G) to perform cleaning after cutting, a photosensor section 107 (FIG. 9, FIG. 10D) to photograph a cutting state, and a control section 108 (FIG. 9) to control these sections. Note that FIG. 10A to FIG. 10G are detail drawings of the respective sections, and for convenience, the installation direction, scale, and so on are not exact.

The housing section 101 includes a housing cassette 111 in which plural semiconductor substrates 1 are housed, an elevator mechanism 112 to raise/lower the semiconductor substrate 1 to a height at which a transfer hand 114 takes it out, and a Z-axis drive part 113 to drive the raising and lowering of this elevator mechanism.

The hand section 102 includes a transfer hand 114 to take the semiconductor substrate 1 out of the housing cassette 111, hold it by vacuum suction, and transfer it to the sensing section 104, and a Θ1-axis drive part 115a, a Θ2-axis (second rotation axis) drive part 115b, and a Θ3-axis drive part 115C to drive the transfer hand 114 by a Θ1-axis (first rotation axis) to a Θ3-axis (third rotation axis), and a Z-axis drive part 115d to drive the transfer hand 114 by a Z-axis. The transfer hand 114 is a SCARA robot and enables easy delivery to the respective processing sections. Incidentally, the robot mechanism of the transfer hand 114 is not limited to this, and, for example, an orthogonal X-Y axes type is also available.

The chuck table section 103 includes a substrate support (rotary table) 11 to fixedly mount the semiconductor substrate 1 thereon, for example, by vacuum suction and freely rotate the semiconductor substrate 1 at a predetermined rotation speed and a rotation drive part 116 to drive this substrate support 11. The substrate support 11 fixes the semiconductor substrate by a vacuum mechanism. This substrate support 11 becomes a reference plane for processing. Accordingly, in order to maintain flatness accuracy at the time of fixing and processing, it is desirable to use a porous material as a material for a chuck surface (fixedly supporting surface) and chuck the entire surface of the semiconductor substrate 1. A metal-based, ceramic-based, or resin-based material is used as a material for a portion including the chuck surface. In this embodiment, at the time of cutting of the front surface of the semiconductor substrate 1, the semiconductor substrate 1 which is fixedly mounted on the substrate support 11 is cut while being rotated at a rotation speed approximately between 800 rpm and 1600 rpm.

The sensing section 104 includes a CCD camera 117, a rotary table 118 to fixedly mount the semiconductor substrate 1 thereon and freely rotate the semiconductor substrate 1 at a predetermined rotation speed, and a rotation drive part 119 to drive this rotary table 118, and an image of an outer periphery of the semiconductor substrate 1 mounted on the rotary table 118 is taken by the CCD camera 117.

The cutting section 105 includes a hard tool 10 which is a cutting tool made of diamond or the like, and has an X-stage 120 and a Y-stage 121 where the tool 10 is placed, an X-axis drive part 122 to drive the tool 10 in an X-direction (shown by an arrow M in FIG. 10E) by the X-axis stage 120, and a Y-axis drive part 123 to drive the tool 10 in a Y-direction (shown by an arrow N in FIG. 10E) by the Y-axis stage 121.

The cleaning section 106 includes a spin table 124 to rotate the semiconductor substrate 1 at a predetermined rotation speed while fixing it by vacuum, a rotation drive part 125 to rotationally drive the spin table 124, and a nozzle 126 to discharge cleaning water to the front surface of the semiconductor substrate 1, and the cleaning water is discharged to the front surface of the semiconductor substrate 1 from the nozzle 126 while the semiconductor substrate 1 is being rotated while fixed by vacuum by the spin table 124 to thereby rinse away dust particles remaining on the front surface after processing. Thereafter, the semiconductor substrate 1 is rotated at high speed by the spin table 124 while air is being blown, and dried while the cleaning water remaining on the front surface of the substrate is thrown off.

The photosensor section 107 includes a light-transmitting part 127 and a light-receiving part 128 which are placed facing the semiconductor substrate 1 fixedly mounted on the substrate support 11 of the chuck table section 103. The light-transmitting part 127 is placed on one side, and the light-receiving part 128 is placed on the other side.

The control section 108 includes a drive control section 129 which controls the Z-axis control section 113 of the housing section 101, the Θ1-axis to Θ3-axis drive parts 115a to 115c and the Z-axis drive part 115d of the hand section 102, the rotation drive part 116 of the chuck table section 103, the rotation drive part 119 of the sensing section 104, the X-axis drive part 122 and the Y-axis drive part 123 of the cutting section 105 and the rotation drive part 125 of the cleaning section 106 respectively, a detecting part 130 which detects light transmission and light reception of the photosensor section 107, a computing part 131 which calculates a center position of the semiconductor substrate 1 using a result of the image taken by the CCD camera 117 of the sensing section 104 and measures and computes the size of the semiconductor substrate 1 together with the photosensor section 107, a main control part 132 which collectively controls the drive control part 129, the detecting part 130, and the computing part 131, a display part 133 which displays a control state and so on of the main control part 132, and a movement instructing part 134 which gives various drive instructions to the main control part 132.

The cutting process will be explained using FIG. 11 and FIG. 12.

Figure 11:
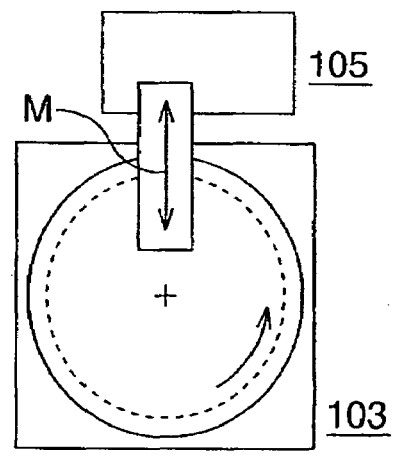
FIG. 11 is a schematic structural view showing the arrangement of respective sections of the cutting apparatus.
Figure 11:
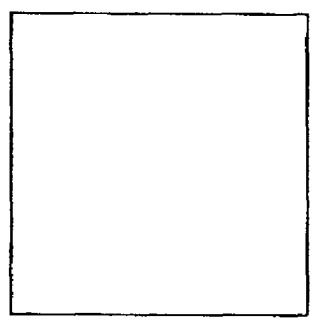
Figure 11:
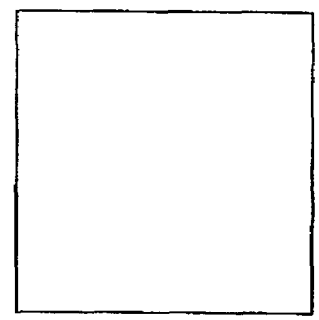
Figure 11:
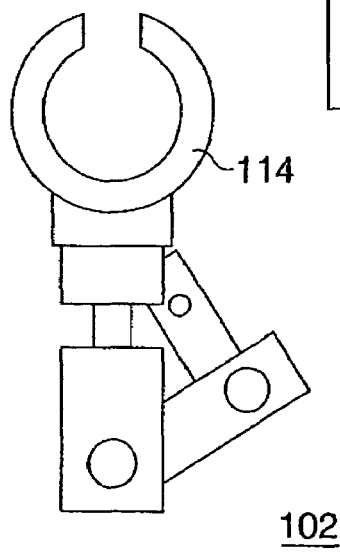
Figure 11:
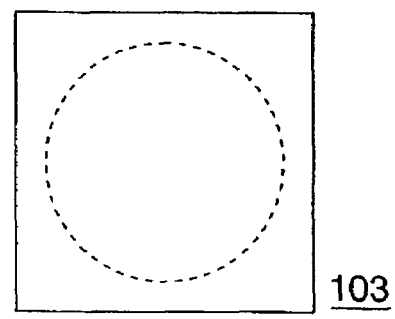

FIG. 11 is a schematic view showing the arrangement of the housing section 101, the chuck table section 103, the sensing section 104, the cutting section 105 and the cleaning section 106 with the hand section 102 as a center. Here, the photosensor 107 and the control section 108 are not shown.

Figure 12:
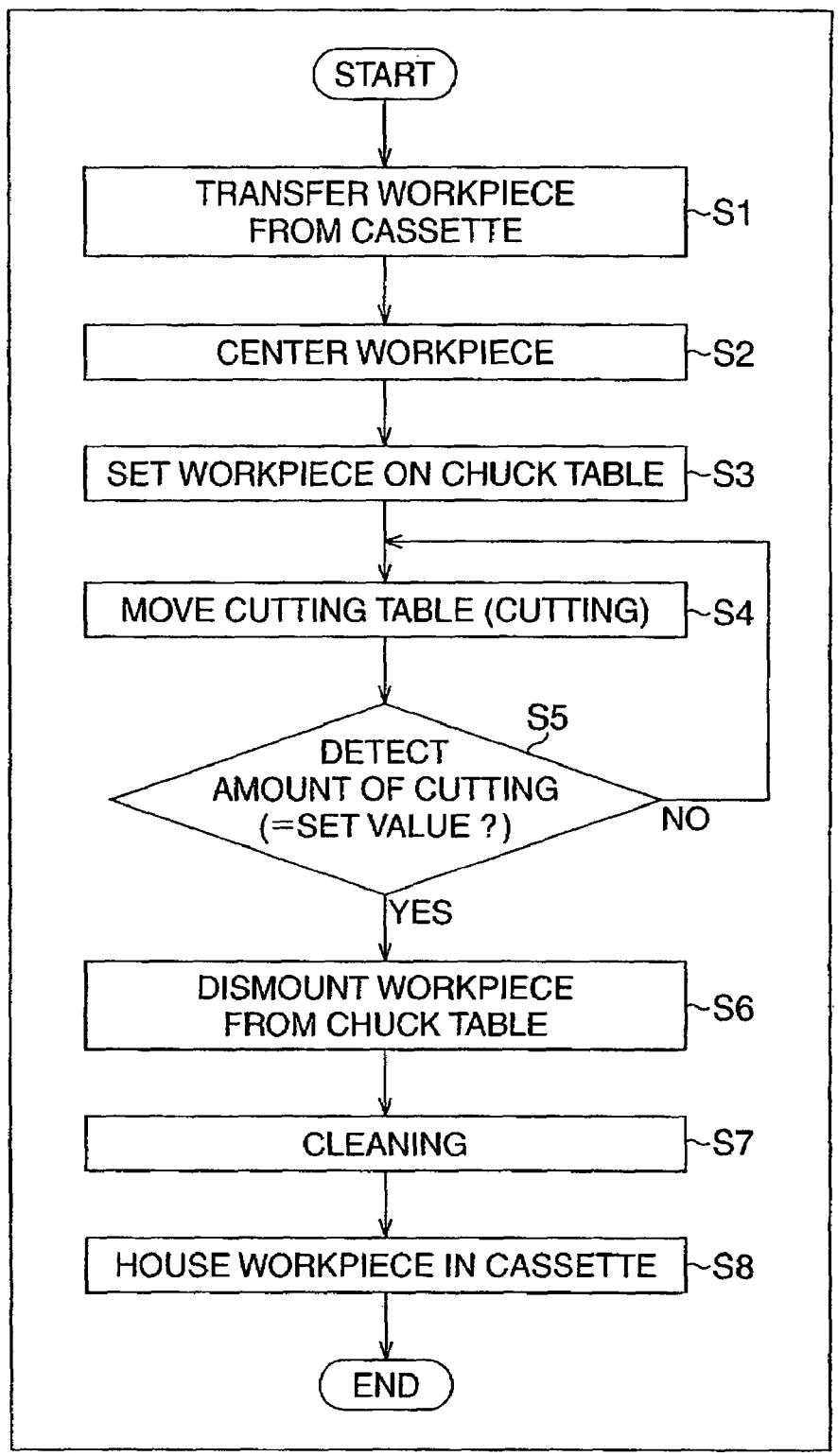
FIG. 12 is a flowchart of a cutting process.

FIG. 12 is a flowchart showing this cutting process.

First, the transfer hand 114 of the hand section 102 takes the semiconductor substrate 1 out of the housing cassette 111 of the housing section 101 in which the semiconductor substrate 1 is housed (step S1). By the elevator mechanism 112 of the housing section 101, the semiconductor substrate 1 is raised or lowered to the height at which the transfer hand 114 takes it out.

Then, the transfer hand 114 transfer the semiconductor substrate 1 to the sensing section 104 while holding the semiconductor substrate 1 by vacuum. In the sensing section 104, the semiconductor substrate 1 is rotated by 360° by the rotary table 118, the image of the outer periphery of the semiconductor substrate 1 is taken by the CCD camera 117, and a result thereof is processed by the computing part 131 of the control section 108 to thereby calculate the center position of the semiconductor substrate 1 (step S2).

Thereafter, the transfer hand 114 corrects the center position based on a calculated result of the center position and transfers the semiconductor substrate 1 to the chuck table section 103, and the substrate support 11 fixes it by vacuum (step S3). This substrate support 11 becomes a reference plane for processing. Accordingly, in order to maintain flatness accuracy at the time of fixing and processing, it is desirable to use a porous material as a material for a chuck surface and chuck the entire surface of the semiconductor substrate 1.

A metal-based, ceramic-based, or resin-based material is used as the material. The light-transmitting part 127 and the light-receiving part 128 are placed facing the upper and lower sides of the chucked semiconductor substrate 1, respectively, measure and compute the size of the semiconductor substrate 1 together with the control section, feed back a result there of to the X-axis control part 122 of the cutting section 105, and the amount of movement for cutting is instructed. Here, when a cutting surface is a wiring forming surface, specifically as shown in FIG. 5, it is desirable that a laser beam is irradiated to scatter a resist mask by heating to thereby expose the front surface. Then, the position is measured by a reflection-type sensor using an infrared laser beam such as shown in FIG. 6. Incidentally, a transmission type sensor may be used for the aforementioned measurement of the position.

Figure 10A:
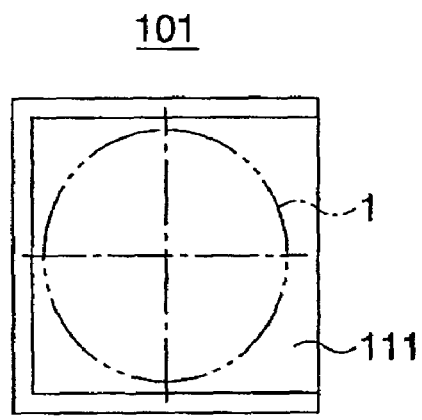
FIG. 10A to FIG. 10G are schematic structural views showing the structure of the cutting apparatus.
Figure 10B:
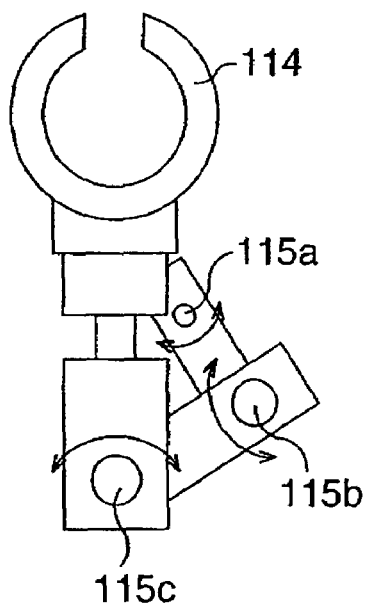
Figure 10C:
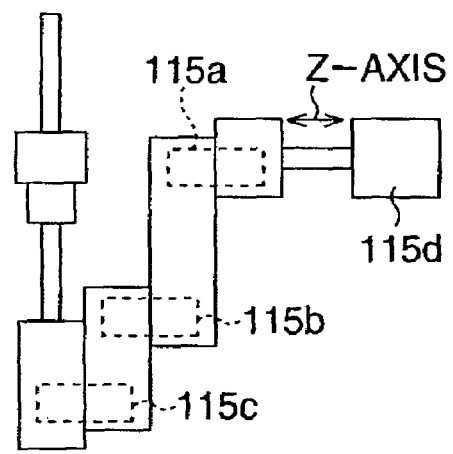
Figure 10D:
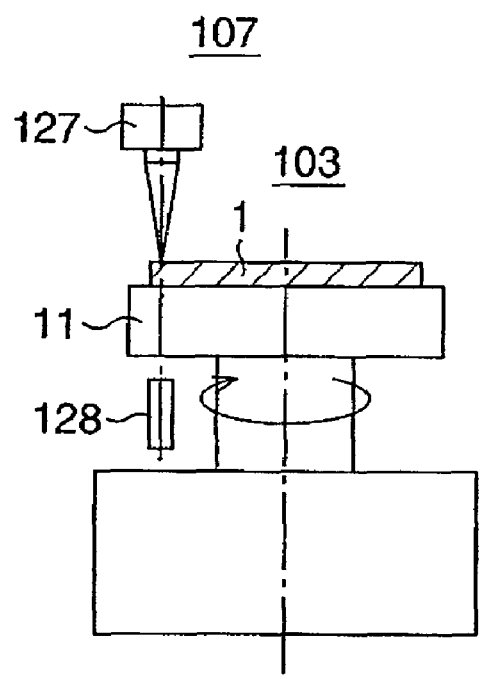
Figure 10E:
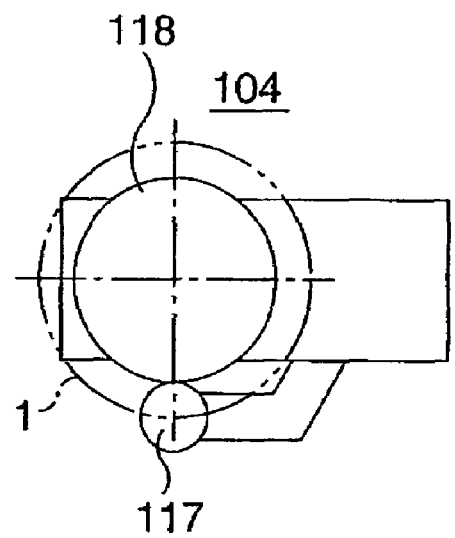
Figure 10F:
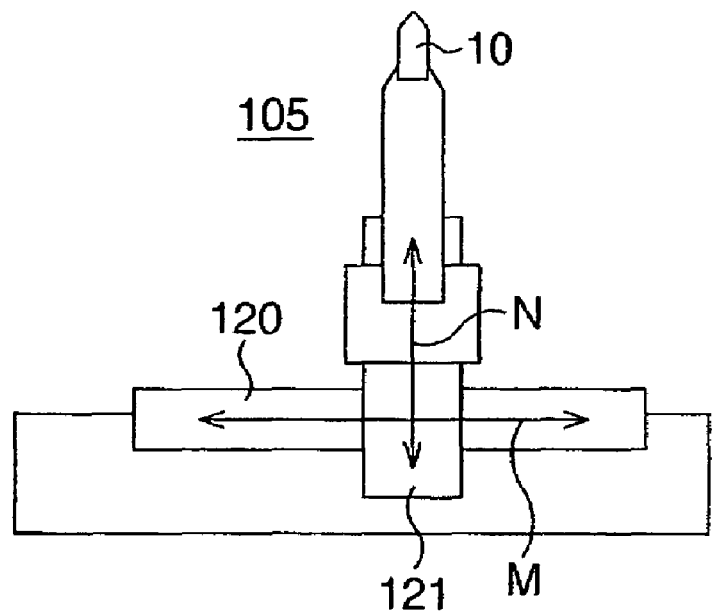
Figure 10G:
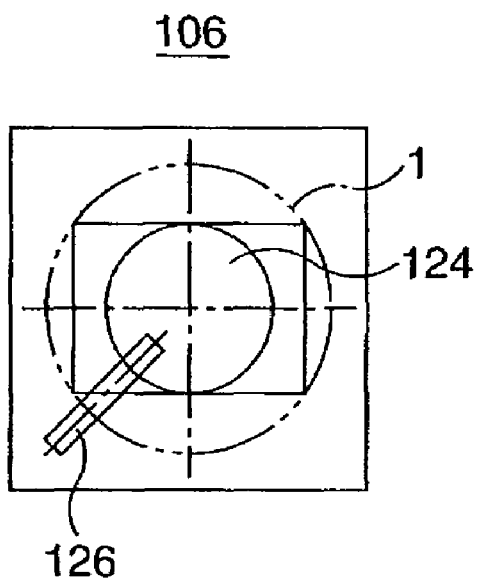

Thereafter, based on the aforementioned computed result (substrate size), the tool 10 for cutting moves in the direction of the same arrow M as in FIG. 10F by the X-axis stage 120 and starts cutting (step S4). If the amount of cutting reaches a set value, cutting to reach a set size is completed (step S5).

Subsequently, the transfer hand 114 dismounts the semiconductor substrate 1 from the substrate support 11 (step S6) and transfers it to the cleaning section 106. In the cleaning section 106, dust particles remaining on the front surface of the semiconductor substrate 1 after processing is rinsed away by the cleaning water discharged from the nozzle 126 while the semiconductor substrate 1 is being rotated while fixed by vacuum by the spin table 124. Thereafter, the semiconductor substrate 1 is rotated at high speed while air is being blown, and dried while the cleaning water is thrown off (step S7). After having been dried, the semiconductor substrate 1 is taken out again by the transfer hand and finally housed in the housing cassette 111 of the housing section 101 (step S8).

In this embodiment, after, with the wiring forming surface on which the wirings and the insulating film are formed as a reference, the back surface thereof is ground by the aforementioned grinding apparatus, the surfaces of respective wirings and the surface of the insulating film are subjected to planarization processing with the back surface as a reference by the aforementioned cutting apparatus.

Second Embodiment

Here, a silicon semiconductor substrate is shown as an example of a substrate, and a case where a multilayer wiring layer formed by stacking a plurality of wiring layers each composed of wirings in an insulator is formed when an LSI is manufactured is disclosed.

Figure 13:
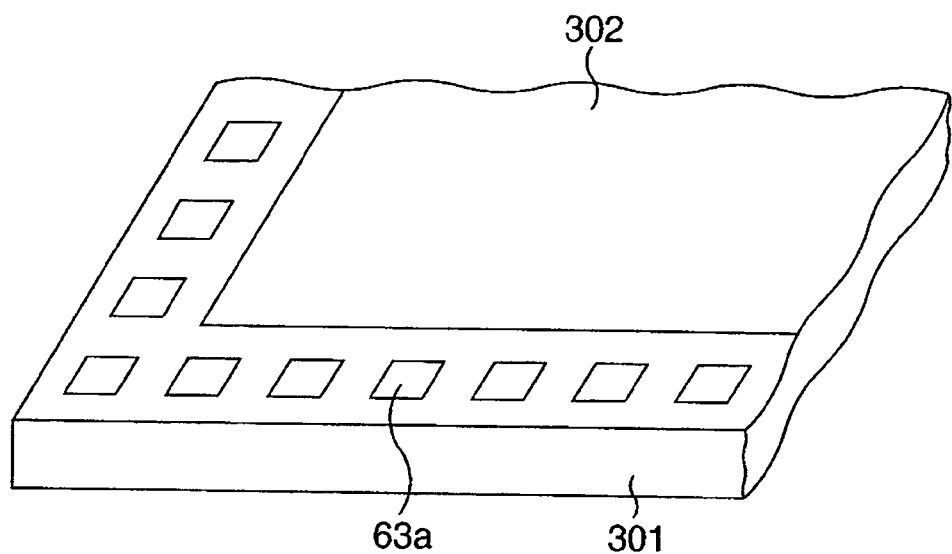
FIG. 13 is a schematic perspective view showing a general view of a semiconductor device to which the present invention is applied.
Figure 14:
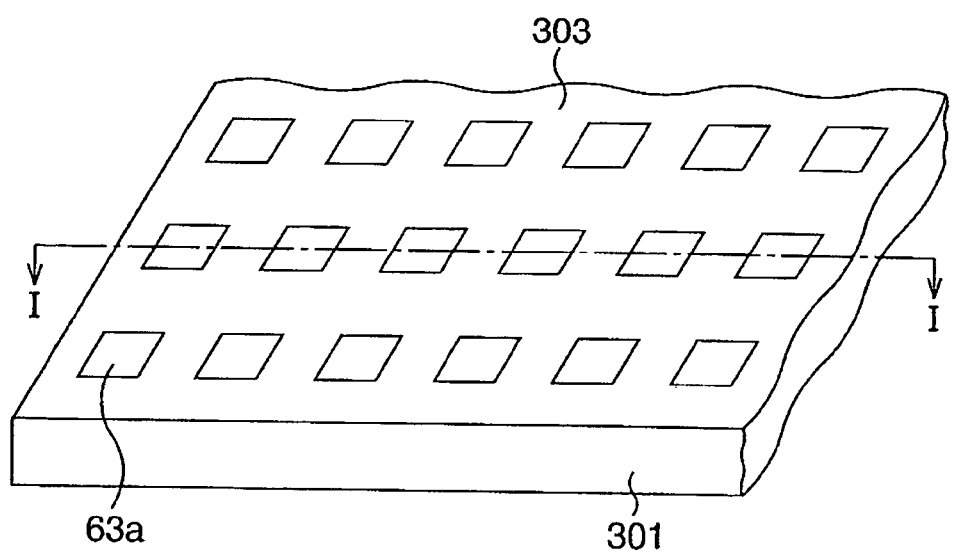
FIG. 14 is a schematic plan view showing a general view of a semiconductor device to which the present invention is applied and which is disclosed in this embodiment.

Among semiconductor devices including a multilayer wiring layer are those which have forms such as shown in FIG. 13 and FIG. 14. In the semiconductor device in FIG. 13, electrodes 63a are formed so as to surround a periphery of an element region 302 where plural (many) semiconductor elements (MOS transistors or the like) are formed in a silicon semiconductor substrate 301, and the respective semiconductor elements and the electrodes 63a are electrically connected. On the other hand, in the semiconductor device in FIG. 14, plural electrodes 63a are formed in matrix in the semiconductor substrate 301, and plural (many) semiconductor elements are formed between the electrodes 63a. Namely, in the case of FIG. 14, regions between the electrodes 63a become an element region 303. The present invention is applicable to both of the semiconductor devices in FIG. 13 and FIG. 14, but in the following explanation, for convenience, the semiconductor device having the form shown in FIG. 14 is shown as an example, and, for example, schematic sections taken along the dashed line I-I in FIG. 14 will be shown in and after FIG. 15A.

FIG. 15A to FIG. 15D, FIG. 16A to FIG. 16C, FIG. 17A to FIG. 17C, FIG. 18A to FIG. 18C, and FIG. 19A to FIG. 19C are schematic sectional views showing a manufacturing method of the semiconductor device including a multilayer wiring according to this embodiment step by step.

Figure 15A:
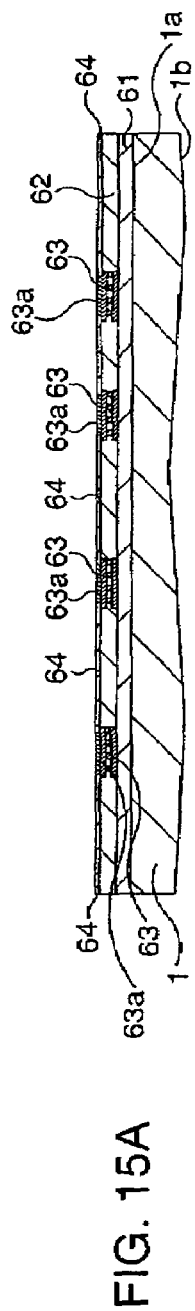
FIG. 15A to FIG. 15D are schematic sectional views showing a manufacturing method of a semiconductor device including a multilayer wiring according to a second embodiment step by step.

As shown in FIG. 15A, the silicon semiconductor substrate 1 is prepared, and formed in sequence on the front surface (wiring forming surface 1a) of the substrate are an impurity diffusion region 61 in which impurity diffusion layers of respective semiconductor elements are formed, LSI wirings 63 embedded in an insulating layer 62, for example, made of an inorganic substance on the insulating diffusion region 61, and a protective film 64 formed on the LSI wirings 63 in such a manner that the surfaces of the electrodes 63a of the LSI wiring 63 are exposed. Incidentally, in the example shown, regions between the adjacent electrodes 63a (and LSI wirings 63) become the element region 303 in FIG. 14. In this case, the element region 303 is the sum of the respective regions between the adjacent electrodes 63a.

Figure 20A:
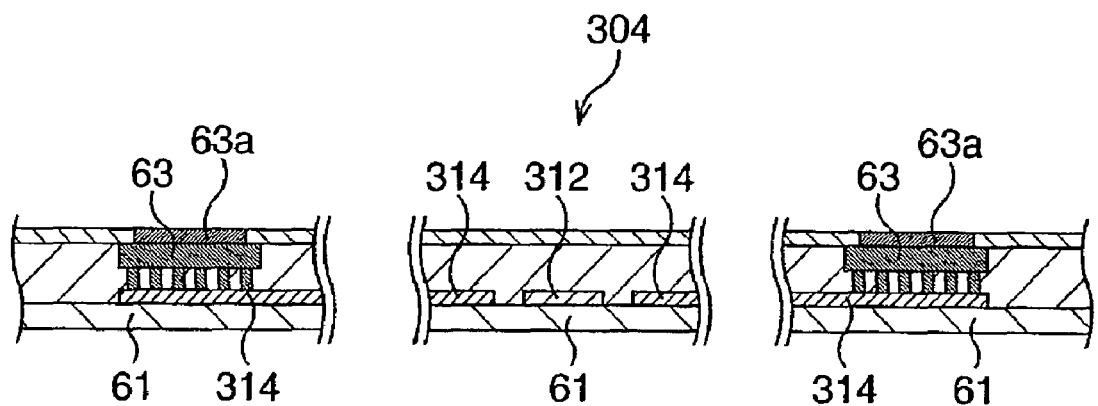
FIG. 20A and FIG. 20B are schematic sectional views showing a state where an MOS transistor is formed in a element region.
Figure 20B:
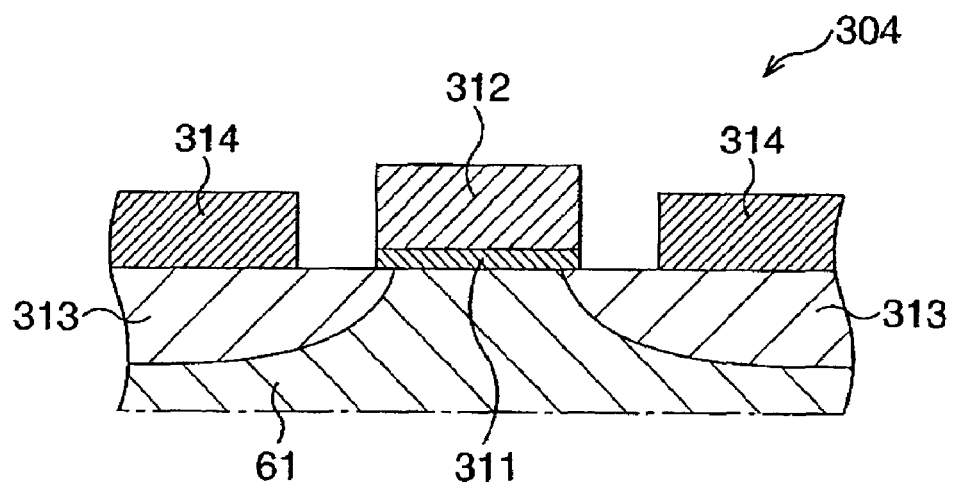

Here, the respective semiconductor elements are not shown in FIG. 15A for convenience. To be more exact, as shown in FIG. 20A, plural (many) semiconductor elements, here MOS transistors 304, are formed in the element region 303. As shown in FIG. 20B, in each of the MOS transistors 304, a gate electrode 312 is formed in a pattern on the surface of the element region 303 with a gate insulating film 311 therebetween, and impurities are introduced into the impurity diffusion region 61 on both sides of the gate electrode 312 to from a pair of impurity diffusion layers 313 which become source/drain. Wirings 114 are formed in a pattern so as to be connected to the respective impurity diffusion layers 313 on the surface of the element region 303, and there wirings 314 compose part of the LSI wirings 63. Incidentally, the impurity diffusion region 61 is a region where many impurity diffusion layers of many MOS transistors are formed, and in actuality, there are portions where the impurity diffusion layers exist and portions where no impurity diffusion layer exists, but for convenience in the illustration, this region is collectively expressed as the impurity diffusion region.

Extremely many MOS transistors 304 are formed even in only one region between the adjacent electrodes 63a, so that the MOS transistors 304 are omitted in and after FIG. 15A for convenience.

As a preceding process to subject the wiring forming surface 1a on which the MOS transistors 304, the LSI wirings 63, the protective film 64, and so on are formed to cutting with the tool described above, the back surface 1b of the wiring forming surface 1a is planarized.

Figure 15B:
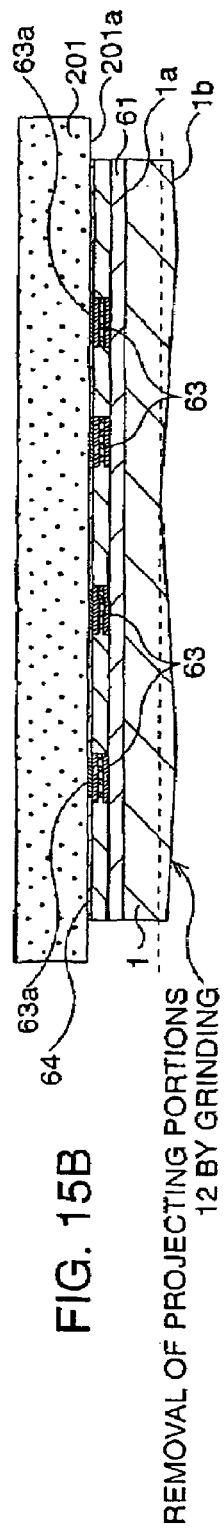

More specifically, as shown in FIG. 15B, a substrate support 201 having a flat supporting surface 201a is prepared, and the semiconductor substrate 1 is fixed to the substrate support 201 by attaching the wiring forming surface 1a to the supporting surface 201a by suction, for example, by vacuum suction. On this occasion, the wiring forming surface 1a is forcibly flattened by being attached by suction to the supporting surface 201a by suction, and therefore the wiring forming surface 1a becomes a reference plane for planarization of the back surface 1b. In this state, planarization processing is performed by subjecting the back surface 1b to machining, here grinding, to grind away the projecting portions 12 of the back surface 1b. In this case, it is desirable to control the amount of cutting of the back surface 1b according to a distance from the wiring forming surface 1a. Hence, control is performed in such a manner that the thickness of the semiconductor substrate 1 becomes uniform, more specifically, the TTV (difference between a maximum thickness and a minimum thickness of the substrate) becomes 1 μm or less.

Figure 15C:
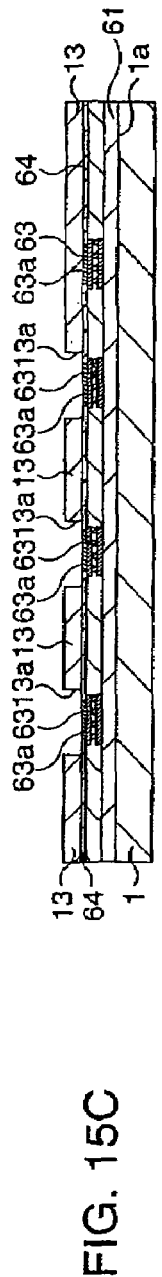

Then, as shown in FIG. 15C, the semiconductor substrate 1 is detached from the substrate support 201, a photosensitive resin, for example, the photosensitive polyimide 13 is applied onto the wiring forming surface 1a of the semiconductor substrate 1, and the photosensitive polyimide 13 is processed by photolithography to form a wiring pattern 13b having such a form that some of the electrodes 63a of the LSI wirings 63 are exposed.

Figure 15D:
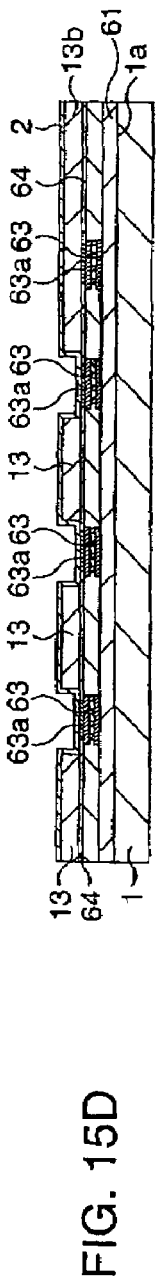

Thereafter, as shown in FIG. 15D, a metal, for example, a copper film (a gold film is also possible but hereinafter an explanation will be given using copper) is formed on the wiring forming surface 1a in such a manner as to cover the photosensitive polyimide 13, for example, by the sputtering method to thereby form the seed layer 2.

Figure 16A:
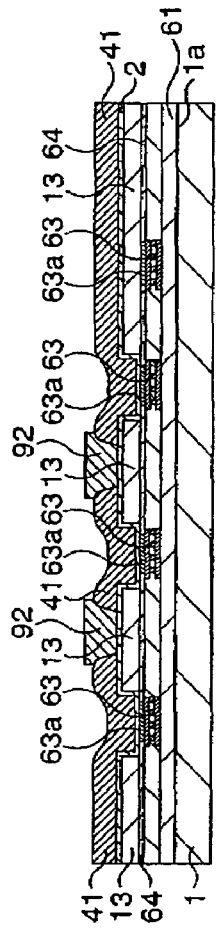
FIG. 16A to FIG. 16C are schematic sectional views showing the manufacturing method of the semiconductor device including the multilayer wiring according to the second embodiment step by step.

Subsequently, as shown in FIG. 16A, a photoresist 92 is applied onto the wiring forming surface 1a, the photoresist 92 is processed by photolithography, openings are formed in a predetermined pattern in the photoresist 92, and thereafter with the seed layer 2 as an electrode, copper is deposited by the plating method.

Figure 16B:
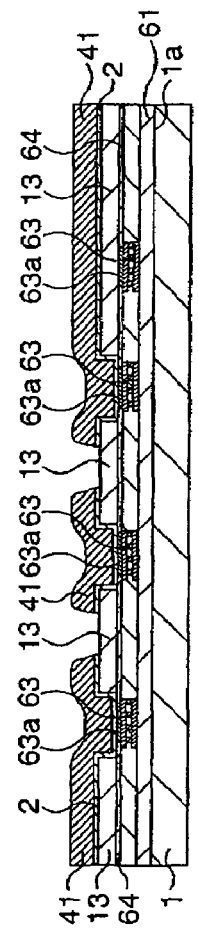

Then, as shown in FIG. 16B, after the photoresist 92 is stripped off, the seed layer 2 is removed by etching with the deposited copper as a mask.

Figure 16C:
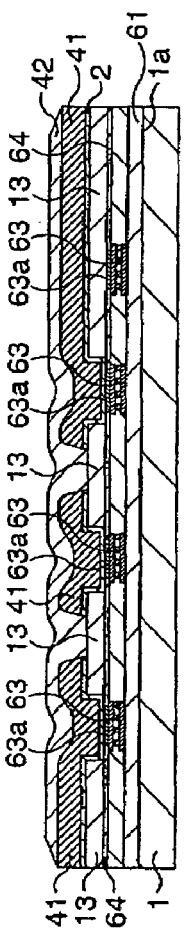

Subsequently, as shown in FIG. 16C, an insulating resin 42 is applied in such a manner that wirings 41 are embedded therein and solidified. Incidentally, it is also possible to remove the exposed seed layer 2 when the insulating resin 42 is formed.

Then, the wiring forming surface 1a is planarized by being subjected to cutting with the tool.

Figure 17A:
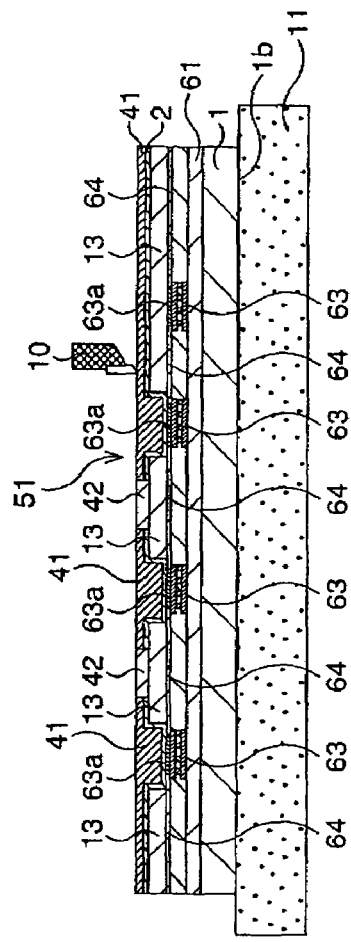
FIG. 17A to FIG. 17C are schematic sectional views showing the manufacturing method of the semiconductor device including the multilayer wiring according to the second embodiment step by step.

More specifically, as shown in FIG. 17A, the semiconductor substrate 1 is fixed to the substrate support 11 by attaching the back surface 1b to the supporting surface 11a of the substrate support 11, for example, by vacuum suction. On this occasion, the semiconductor substrate 1 is made uniform in thickness by the planarization processing in FIG. 15B for the back surface 1b and undulations and the like are forcibly eliminated from the back surface 1b by the attachment of the back surface 1b to the supporting surface 11a by suction, whereby the back surface 1b becomes a reference plane for planarization of the wiring forming surface 1a. In this state, surface layers of the wirings 41 and the insulating resin 42 on the wiring forming surface 1a are subjected to machining, here cutting with the tool 10 while the semiconductor substrate 1 is being rotated, for example, at a rotation speed approximately between 800 rpm and 1600 rpm and thereby planarized. As a result of this planarization processing, a first wiring layer 51 in which the wirings 41 are embedded in the insulating resin 42 with their upper surfaces being exposed is formed. Note that in FIG. 17A, for convenience, the surface layers of the wirings 41 and the insulating resin 42 are shown as a continuous flat surface.

Figure 17B:
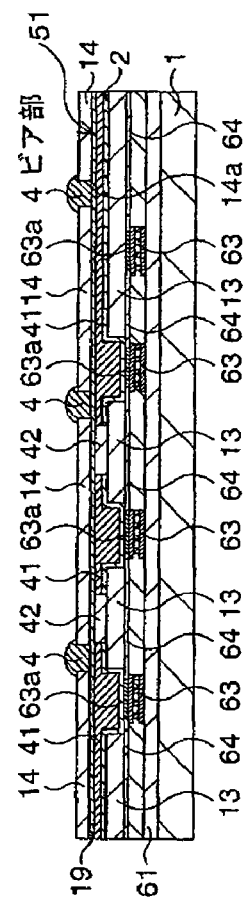

Thereafter, as shown in FIG. 17B, after a seed layer 19 which becomes a plating electrode is formed by sputtering on the planarized first wiring layer 51, the photoresist 14 is applied, and by processing the photoresist 14 by photolithography, the predetermined via pattern 14a is formed. Then, the via pattern 14a is filled with copper or the like by the plating method to form the via portions 4.

Figure 17C:
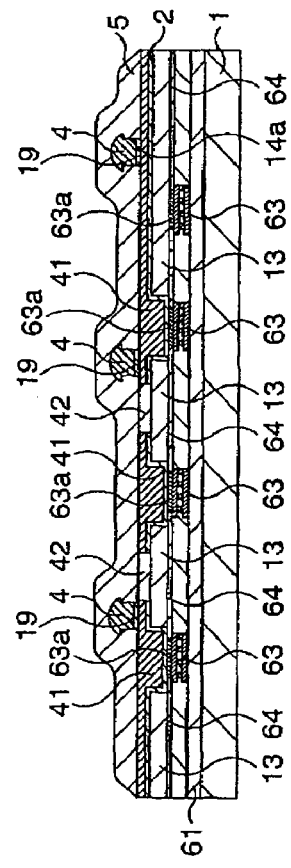

Subsequently, as shown in FIG. 17C, after the photoresist 14 is stripped off, the seed layer 19 is removed, for example, by wet etching using hydrofluoric acid, and the insulating resin 5 is formed on the wiring forming surface 1a so as to cover and fill up the via portions 4.

Thereafter, the wiring forming surface 1a is subjected again to cutting with the tool and thereby planarized.

Figure 18A:
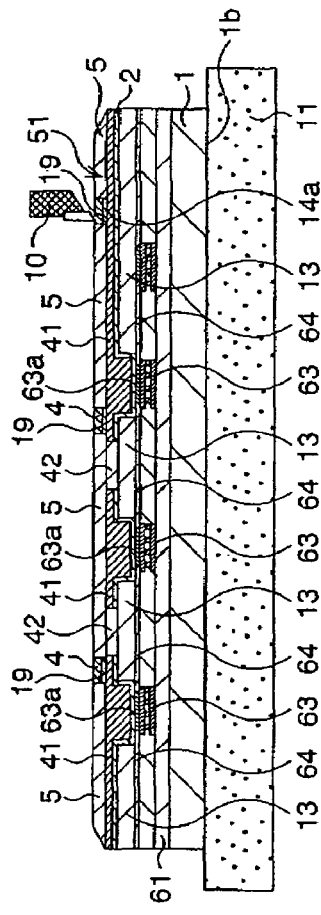
FIG. 18A to FIG. 18C are schematic sectional views showing the manufacturing method of the semiconductor device including the multilayer wiring according to the second embodiment step by step.

More specifically, as shown in FIG. 18A, the semiconductor substrate 1 is fixed to the substrate support 11 by attaching the back surface 1b to the supporting surface 11a of the substrate support 11, for example, by vacuum suction. On this occasion, similarly to the above, the back surface 1b becomes a reference plane for the planarization of the wiring forming surface 1a. In this state, surface layers of the via portions 4 and the insulating resin 5 on the wiring forming surface 1a are planarized by being subjected to machining, here cutting with the tool 10. As a result of this planarization processing, a via layer 21 whose thickness is uniformed and in which the via portions 4 are embedded in the insulating resin 5 with their upper surfaces being exposed is formed. Incidentally, in actuality, the surface layers of the via portions 4 and the insulating film 5 are planarized only after the cutting with the tool 10, but in FIG. 18A, for convenience in the illustration, the surfaces of the via portions 4 and the insulating film 5 which the tool 10 has not yet passed are also shown as a continuous flat surface.

Figure 18B:
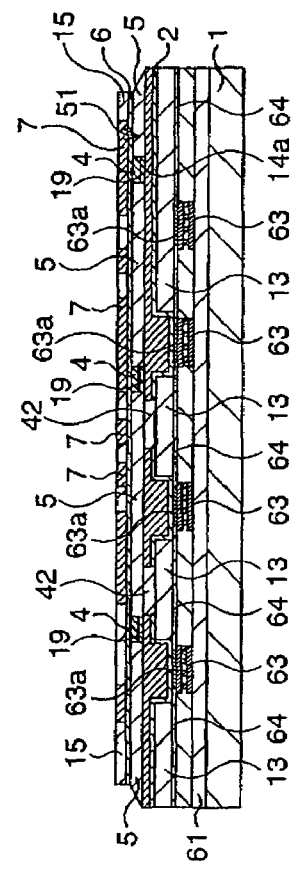

Then, as shown in FIG. 18B, after a copper film is deposited on surfaces of the planarized via portions 4 and the insulating resin 5 by the sputtering method to form the seed layer 6, the photoresist 15 is applied, and by processing this photoresist 15 by photolithography, the predetermined wiring pattern 15a is formed. Then, with the seed layer 6 as an electrode, the wirings 7 which fills up the wiring pattern 15a of the photoresist 15 are formed by the plating method.

Figure 18C:
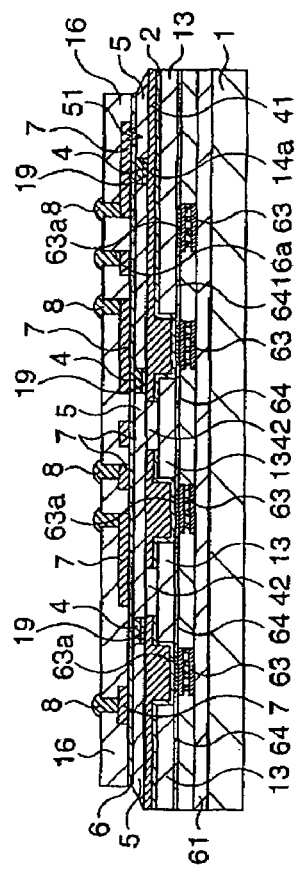

Subsequently, as shown in FIG. 18C, after the photoresist 15 is removed, for example, using the alkaline stripping solution, the photoresist 16 is applied onto the wirings 7 so that the wirings 7 are embedded therein, and by processing this photoresist 16 by photolithography, the predetermined via pattern 16a is formed. Copper or the like is embedded in the via pattern 16a by the plating method to form the via portions 8.

Figure 19A:
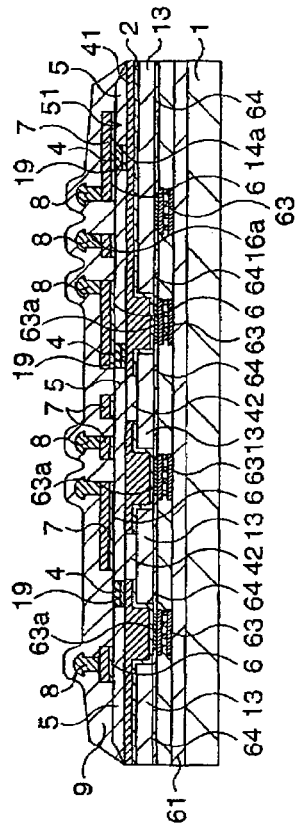
FIG. 19A to FIG. 19C are schematic sectional views showing the manufacturing method of the semiconductor device including the multilayer wiring according to the second embodiment step by step.

Then, as shown in FIG. 19A, after the photoresist 16 is stripped off, the seed layer 6 is removed, for example, by wet etching using the hydrofluoric acid, and the insulating resin 9 is formed on the wiring forming surface 1a so as to cover and fill up the wirings 7 and the via portions 8.

Thereafter, the wiring forming surface 1a is planarized by being subjected again to cutting with the tool.

Figure 19B:
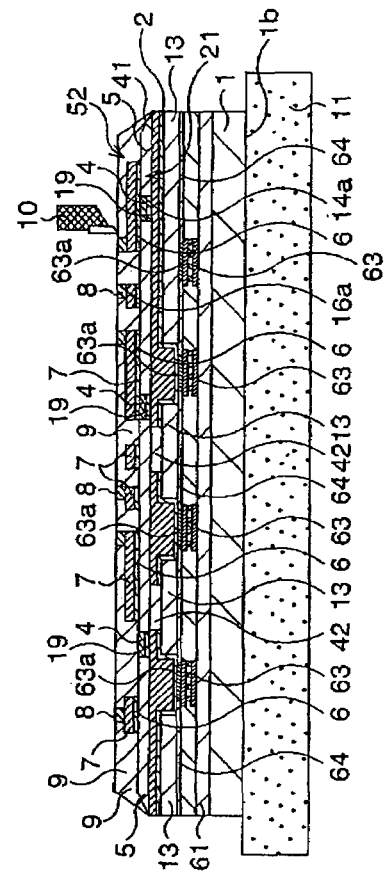

More specifically, as shown in FIG. 19B, the semiconductor substrate 1 is fixed to the substrate support 11 by attaching the back surface 1b to the supporting surface 11a of the substrate support 11, for example, by vacuum suction. On this occasion, similarly to the above, the back surface 1b becomes a reference plane for the planarization of the wiring forming surface 1a. In this state, surface layers of the via portions 8 and the insulating resin 9 on the wiring forming surface 1a are planarized by being subjected to machining, here cutting with the tool 10. As a result of this planarization processing, a second wiring layer 52 whose thickness is uniformed and in which the wirings 7 and the via portions 8 connected thereto are embedded in the insulating resin 9 so that upper surfaces of the via portions 8 are exposed is formed. Note that in FIG. 19B, for convenience in the illustration, the surface layers of the via portions 8 and the insulating film 9 are shown as a continuous flat surface.

Figure 19C:
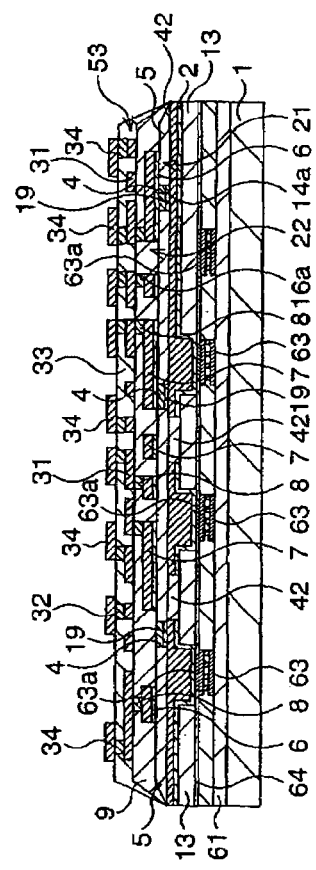

Then, as shown in FIG. 19C, in the same manner as the formation of the second wiring layer 52, that is, by undergoing the same series of processes as in FIG. 18B, FIG. 18C, FIG. 19A, and FIG. 19B several times, a stacked structure in which wirings and via portions connected thereto are embedded in insulating resins is formed. A third wiring layer 53 whose thickness is uniformed and in which wirings 31 and via portions 32 connected thereto are embedded in an insulating resin 33 and wirings 34 formed on this third wiring layer 53 are shown as an example.

Thereafter, through the formation of a protective film (not shown) which covers the entire surface of the semiconductor substrate 1, a semiconductor device having the element region 303 (including plural MOS transistors 304) and a multilayer wiring structure is finished on the semiconductor substrate 1.

In this embodiment, after the back surface 1b of the semiconductor substrate 1 is first subjected to planarization processing with the wiring forming surface 1a as a reference, based on this, the via layer 21 and the respective wiring layers 51 to 53 each having a uniform thickness are formed in sequence on the wiring forming surface 1a with the back surface 1b as a reference, and hence even if many wiring layers are further stacked, a fine wiring structure is realized without impairing flatness while the occurrence of irregularities is prevented.

As explained above, according to this embodiment, variations in the thickness of the semiconductor substrate 1 are made uniform, and without disadvantages such as dishing and any limitation on a wiring design, high-speed planarization becomes possible easily and inexpensively, which makes it possible to easily and finely realize a semiconductor device including a fine multilayer wiring structure.

Incidentally, in this embodiment, an explanation is given regarding one semiconductor substrate, but it is also possible to perform respective processes of this embodiment on plural semiconductor substrates which compose a lot to make the thicknesses of the respective semiconductor substrates uniform. Consequently, for example, it becomes possible to perform processing such as cutting on respective substrates in one and the same lot under the same condition.

MODIFICATION EXAMPLE

A modification example of this embodiment will be described below.

Figure 21:
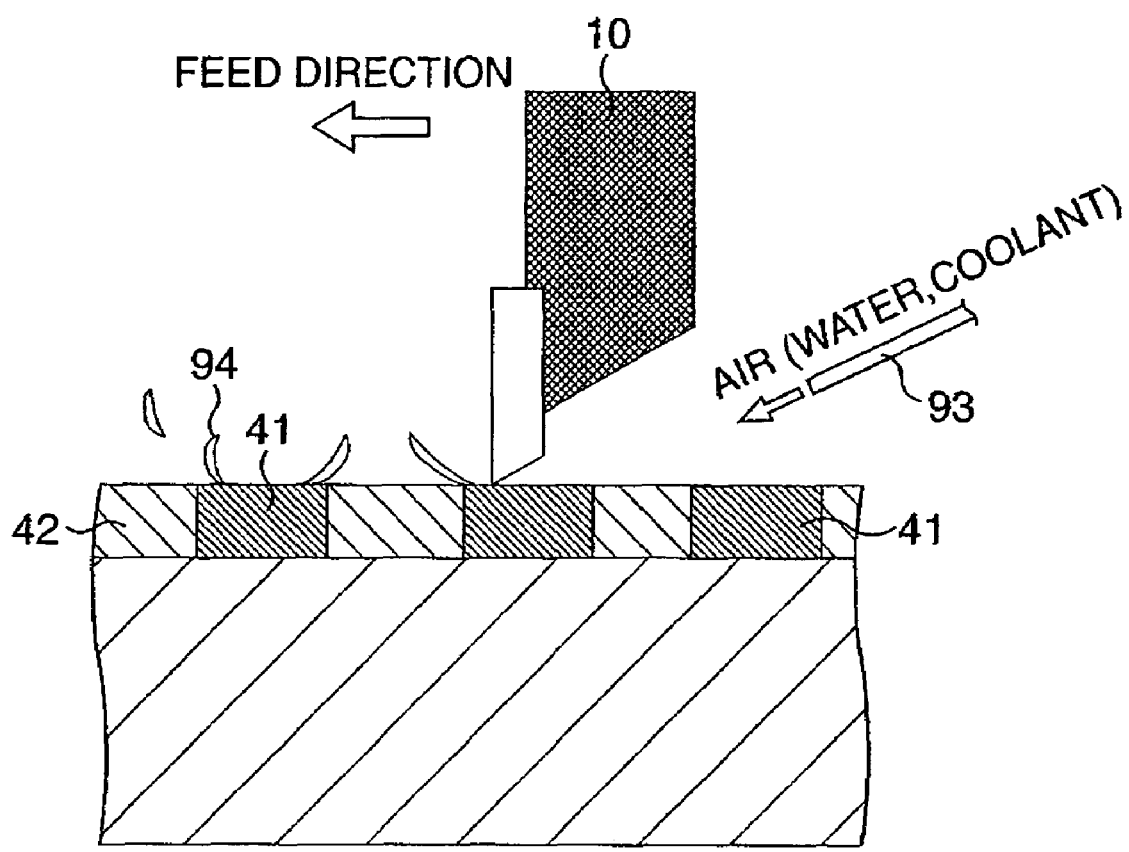
FIG. 21 is a schematic sectional view showing a main process of a modification example of the manufacturing method of the semiconductor device including the multilayer wiring according to the second embodiment.

In this modification example, trace processing of a cutting surface is added in the cutting process with the tool explained in the second embodiment. An outline of this trace processing is shown in FIG. 21.

In the cutting with the tool according to the second embodiment, cutting in a wide range can be performed at low cost, in a short time, and with an extremely high degree of precision (nano-order flat roughness).

However, in this case, chippings are produced in cutting and sometimes adhere to the cutting surface. Out of insulating layers and wirings (including via portions) to be cut, chippings from an insulating material only adhere to the cutting surface by static electricity and therefore can be easily removed after cutting, but chippings from a wiring material, especially Au, are bonded to the cutting surface once they adhere thereto, and cannot be easily removed by cleaning or the like. This causes a surface shape in which chippings having a size from several μm to a few tens of μm adhere to the cutting surface with high flatness of nano-order roughness, which causes a possibility of hindering the planarization processing. This becomes remarkable especially when the wiring material is Au as described above, but Cu, an alloy thereof, or the like also becomes a problem.

In this modification example, in a cutting process with a tool, after a flat cutting surface is formed by cutting, the cutting surface is traced again with this tool in the same position (zero cut) as in the aforementioned cutting. Because of zero cut, chippings adhering to the cutting surface can be surely removed with few new chippings being produced.

However, it is anticipated that the chippings removed by the trace processing adhere again to the cutting surface. To prevent this, it is effective to spray air, water, or coolant in a feed direction of the tool at the time of this trace processing. Here, to bring the tool into contact with the entire surface of the cutting surface, it is necessary to set the feed speed of the tool to a speed equal to or lower than that in cutting.

More specifically, in the cutting process shown in FIG. 17A, after the surface layers of the wirings 41 and the insulating resin 42 on the wiring forming surface 1a are subjected to planarization processing by being cut with the tool 10, as shown in FIG. 21, they are traced with the same tool position (zero cut) as in the cutting position at the time of finishing of the planarization processing while the semiconductor substrate 1 is fixed to the substrate support 11. Feed at this time is the same as at the time of finishing, for example, 10 μm per rotation. At this time, air is sprayed on the cutting surface from an air let-off part 93 in the same direction as in a feed direction of the tool 10 to prevent chippings 94 from adhering thereto again. Here, especially when the chippings are in such a state as to easily adhere, in place of air, water, coolant, or the like may be sprayed at high pressure.

Note that the trace processing of this modification example is similarly applied also to the cutting process in FIG. 18A and the cutting process in FIG. 19B.

According to this modification example, variations in the thickness of the semiconductor substrate 1 are made uniform, occurrence of undulations and warps are prevented, without disadvantages such as dishing and any limitation on a wiring design, high-speed and fine planarization becomes possible easily and inexpensively, and further the flatness of the cutting surface is maintained by surely removing chippings at the time of planarization, which makes it possible to easily and finely realize a semiconductor device including a fine multilayer wiring structure.

Third Embodiment

A case where a supporting base, more specifically a copper plate is used as a substrate and a film-shaped multilayer wiring thin film used as an interposer or the like is formed is disclosed here.

FIG. 22A to FIG. 22C and FIG. 23A to FIG. 23C are schematic sectional views showing a multilayer wiring substrate forming method according to this embodiment step by step.

Figure 22A:
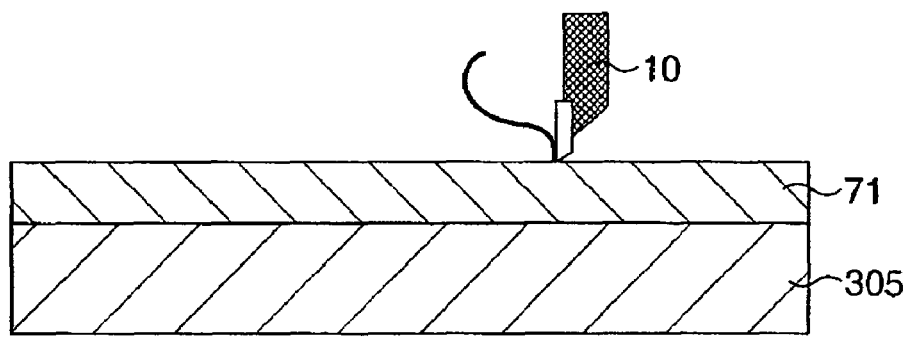
FIG. 22A to FIG. 22C are schematic sectional views showing a multilayer wiring substrate forming method according to a third embodiment step by step.

First, as shown in FIG. 22A, a copper plate 71, for example, having a thickness of a little more than 1 mm and a diameter of 8 inches is attached, for example, to a chuck table 305 of a cutting apparatus by suction and cut with the tool 10 made of diamond to the extent that the tool 10 abuts on the entire front surface of the copper plate 71 to thereby make the thickness of the copper plate uniform. Incidentally, chippings produced at this time are collected and used for reclaiming copper plates.

Figure 22B:
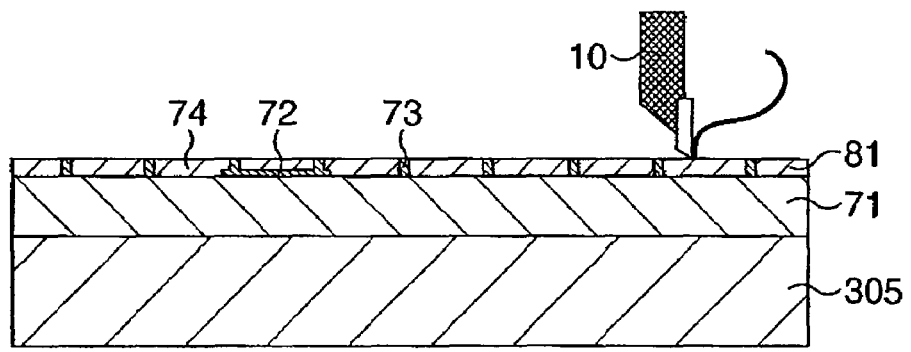

Thereafter, as shown in FIG. 22B, a resist is applied onto the front surface of the copper plate 71 and processed by photolithography to thereby form a first-layer wiring pattern. L/S of the wiring pattern at this time is, for example, 5 μm/5 μm. Then, with the copper plate 71 as a seed layer, wirings 72 are formed by electrolytic plating. Here, a protective film (not shown) is affixed to a back surface of the copper film 71 to prevent the adhesion of the plating thereto. After this, the resist is removed.

Subsequently, a via pattern is formed by the resist, and similarly to the above, with the copper plate 71 as a seed layer, via posts 73 having a height of approximately 12 μm and a diameter of approximately 10 μm are formed by electroplating. Also in this case, a protective film (not shown) is affixed to the back surface of the copper plate 71 to prevent the adhesion of the plating thereto. Thereafter, the resist is removed.

Then, after a polyimide precursor (for example, the product name PI2611 manufactured by HD Microsystem) is applied by spin coating so as to fill up the wirings 72 and the via posts 73, it is cured by heating, for example, at a temperature increase rate of 2° C./min from 370° C. to thereby form a resin film 74. Thereafter, a hole which reaches the front surface of the copper plate 71 is bored in a part of the resin film 74 by a laser beam.

Thereafter, the copper plate 71 is mounted on the chuck table 305 with its back surface downward, the depth of the aforementioned hole is measured, the resin film 74 is planarized by cutting with the tool 10 to a height of approximately 10 μm from the front surface of the copper plate 71 to form a first wiring layer 81 having a uniform thickness in which the wirings 72 and the via posts 73 are embedded in the resin film 74. Here, upper surfaces of the via posts 73 are exposed from a surface of the wiring layer 81. Cutting conditions at this time are, for example, a rotation speed of 1000 rpm, a feed speed of 3 mm/min, a rake angle of the tool 10 of 10°, and a cutting amount of 1 μm.

Figure 22C:
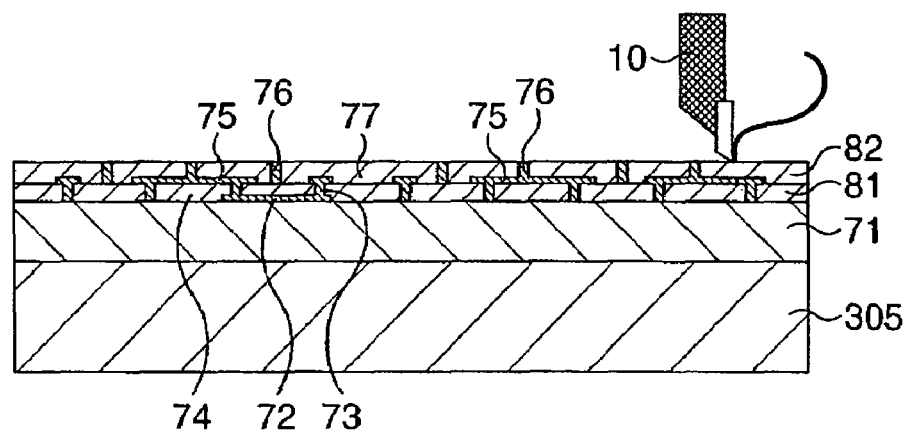

Subsequently, after a seed layer (which is a stacked film of Cr/Cr and its thickness is approximately 100 nm/300 nm) is formed by the sputtering method, as shown in FIG. 22C, in the same manner as above, wirings 75 and via posts 76 are formed in a pattern. After the resist is removed, the seed layer is removed by etching.

Then, in the same manner as above, after the aforementioned polyimide precursor is applied by spin coating so as to fill up the wirings 75 and the via posts 76, it is cured by heating, for example, at a temperature increase rate of 2° C./min from 370° C. to thereby form a resin film 77. Thereafter, a hole which reaches the front surface of the copper plate 71 is bored in a part of the resin film 77 by a laser beam.

Thereafter, the copper plate 71 is mounted on the chuck table 305 with its back surface downward, the depth of the aforementioned hole is measured, the resin film 77 is planarized by cutting with the tool 10 to a height of 10 μm from the front surface of the copper plate 71 to form a second wiring layer 82 having a uniform thickness in which the wirings 75 and the via posts 76 are embedded in the resin film 77. Here, upper surfaces of the via posts 76 are exposed from a surface of the wiring layer 82.

Figure 23A:
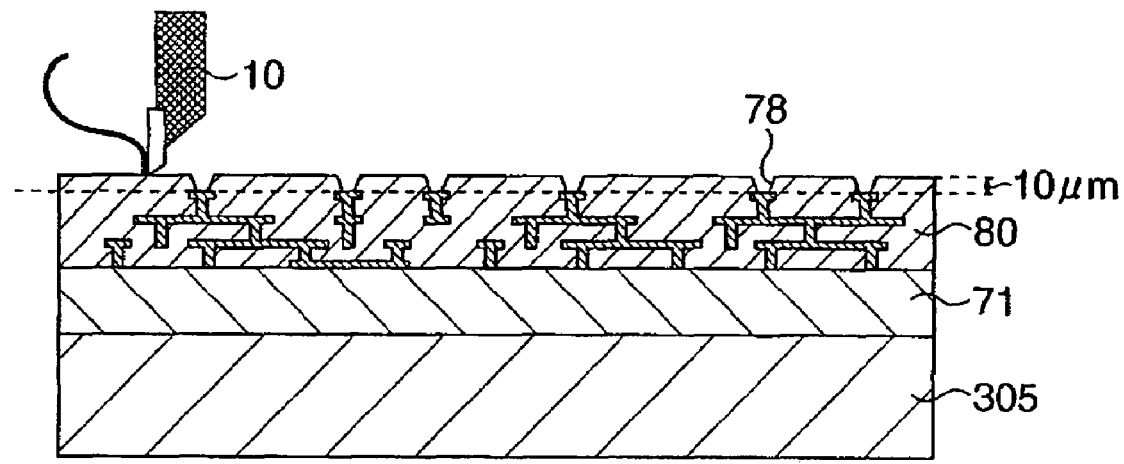
FIG. 23A to FIG. 23C are schematic sectional views showing the multilayer wiring substrate forming method according to the third embodiment step by step.

Subsequently, as shown in FIG. 23A, by repeatedly performing the aforementioned wiring layer forming process, a multilayer wiring thin film composed of a desired number of wiring layers is formed. After this, a protective layer made of polyimide with a thickness of approximately 13 μm is formed. After vias 78 are formed in any positions, the protective layer is planarized by cutting with the tool 10 so as to have a thickness of approximately 10 μm. In the example shown, a multilayer wiring thin film 80 composed of three wiring layers, in the uppermost wiring layer of which only the vias 78 are formed in its surface by the aforementioned cutting with the tool 10, is shown as an example. Incidentally, in the example shown, a portion of the protective layer which is cut so as to have a thickness of approximately 10 μm is shown by a broken line.

Figure 23B:
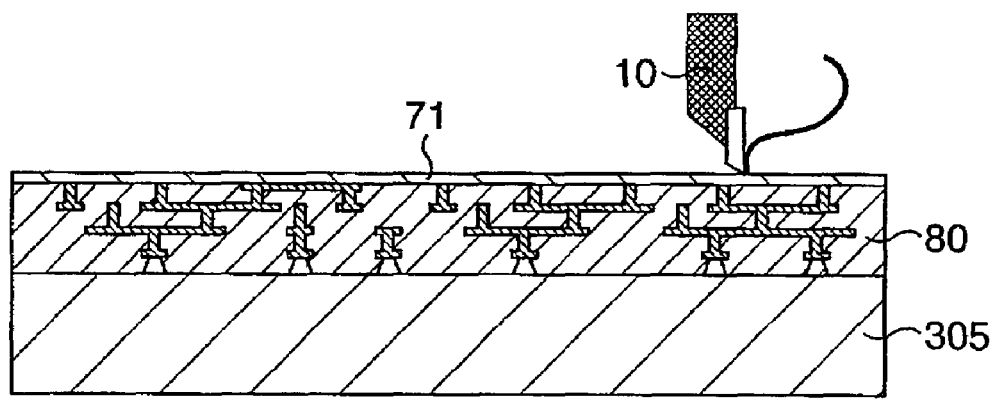

Then, as shown in FIG. 23B, the copper film 71 is placed on the chuck table 305 with the protective layer downward and removed by cutting with the tool 10, leaving only a thickness of 0.5 μm. Incidentally chippings produced at this time are collected and used for reclaiming copper plates.

Figure 23C:
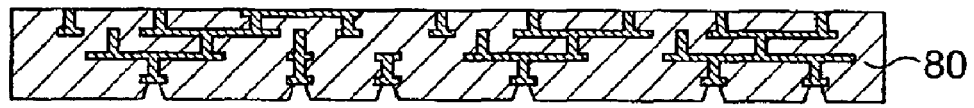

Thereafter, as shown in FIG. 23C, the left copper plate 71 is removed by etching to finish the film-shaped multilayer wiring thin film 80.

Note that in this embodiment, it is also possible that before being cut, the copper plate 71 is previously diced to a depth slightly deeper than the wiring layer to make the wiring layer chips.

As described above, according to this embodiment, when the multilayer wiring thin film is obtained as a single body by finally removing the supporting base, it is possible to easily perform fine control of thicknesses of respective wiring layers composing the multilayer wiring thin film 80 and remove the copper plate 71 efficiently and easily at low cost, resulting in the realization of the multilayer wiring thin film having a fine wiring structure, for example, with a via diameter approximately between 5 μm and 10 mμ and a L/S between 5 μm/5 μm and 20 μm/20 μm.

Fourth Embodiment

A case where a supporting base, more specifically a copper plate is used as a substrate and a film-shaped multilayer wiring thin film used as an interposer or the like is formed is disclosed here as in the third embodiment, but a forming method of respective wiring layers is different.

FIG. 24A to FIG. 24C, and FIG. 25A and FIG. 25B are schematic sectional views showing a multilayer wiring substrate forming method according to this embodiment step by step.

Figure 24A:
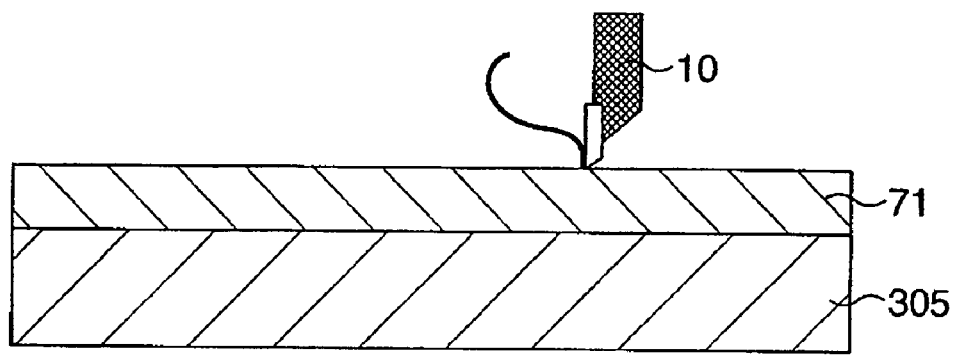
FIG. 24A to FIG. 24C are schematic sectional views showing a multilayer wiring substrate forming method according to a fourth embodiment step by step.

First, as shown in FIG. 24A, the copper plate 71, for example, having a thickness of a little more than 1 mm and a diameter of 8 inches is attached, for example, to the chuck table 305 of the cutting apparatus described above by suction and cut with the tool 10 made of diamond to the extent that the tool 10 abuts on the entire front surface of the copper plate 71 to thereby make the thickness of the copper plate 71 uniform. Incidentally, chippings produced at this time are collected and used for reclaiming copper plates.

Figure 24B:
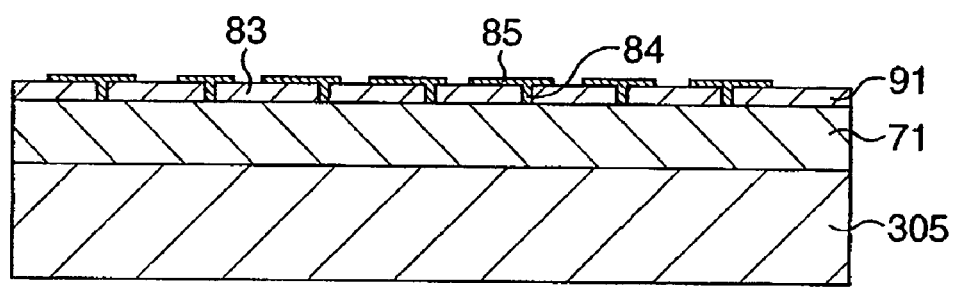

Thereafter, as shown in FIG. 24B, a laminate film 83 made of a photosensitive epoxy resin and having a film thickness of approximately 20 μm is formed on the front surface of the copper plate 71, and by exposing and developing it, via holes 84 each having a diameter of approximately 20 μm are formed. After a surface of the laminate film 83 is roughened by an oxidizing agent, a seed layer is formed by electroless plating.

Subsequently, a wiring pattern (L/S=10 μm/10 μm more or less) is formed by a resist with a film thickness of approximately 10 μm, and a wiring layer 85 is formed by electroplating and fills up the via holes 84. On this occasion, it does not matter that plating overhangs the resist.

Then, the copper plate 71 is mounted on the chuck table 305 with its back surface downward, the wiring layer 85 is planarized by cutting with the tool 10 to a height of 5 μm from the front surface of the laminate film 83 to form a first wiring layer 91 having a uniform thickness in which the via holes 84 and the wiring layer 85 filled with plating are embedded in the laminate film 83. Cutting conditions at this time are, for example, a rotation speed of 1000 rpm, a feed speed of 3 mm/min, a rake angle of the tool 10 of 10°, and a cutting amount of 1 μm. After this, the resist is removed, and the seed layer is removed by etching.

Figure 24C:
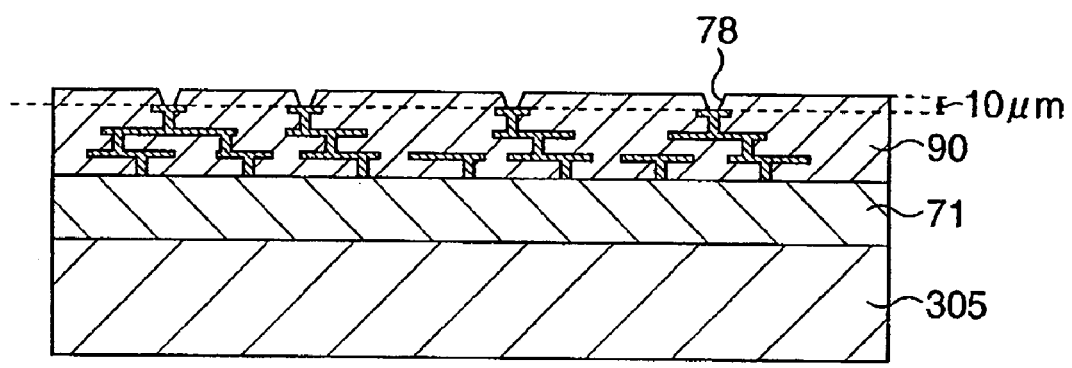

Subsequently, as shown in FIG. 24C, by repeatedly performing the aforementioned wiring layer forming process, a multilayer wiring thin film composed of a desired number of wiring layers is formed. After this, a protective layer made of polyimide with a thickness of approximately 13 μm is formed. After the vias 78 are formed in any positions by a laser, the protective layer is planarized by cutting with the tool 10 so as to have a thickness of approximately 10 μm. In the example shown, a multilayer wiring thin film 90 composed of three wiring layers, in the uppermost wiring layer of which only the vias 78 are formed in its surface by the aforementioned cutting with the tool 10, is shown. Incidentally, in the example shown, a portion of the a protective layer which is cut so as to have a thickness of approximately 10 μm is shown by a broken line.

Figure 25A:
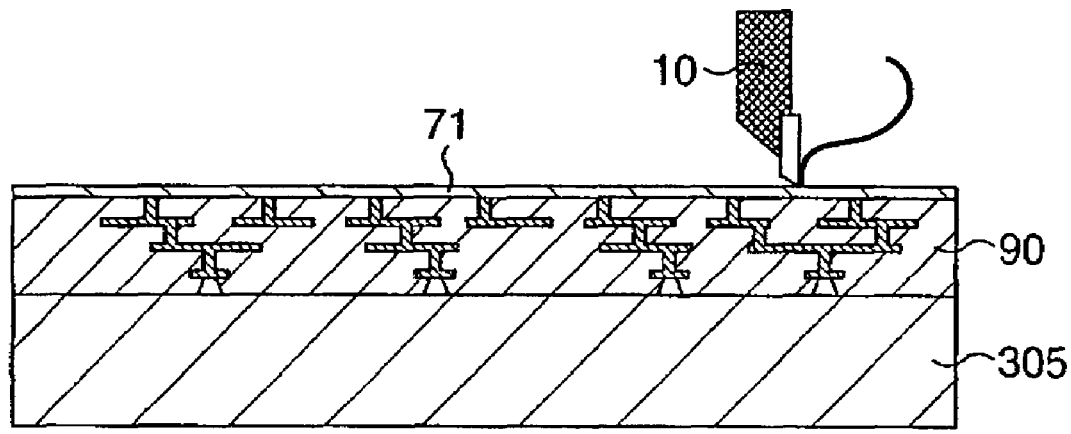
FIG. 25A and FIG. 25B are schematic sectional views showing the multilayer wiring substrate forming method according to the fourth embodiment step by step.

Then, as shown in FIG. 25A, the copper film 71 is placed on the chuck table 305 with the protective layer downward and removed by cutting with the tool 10, leaving only a thickness of approximately 0.5 μm. Incidentally chippings produced at this time are collected and used for reclaiming copper plates.

Figure 25B:
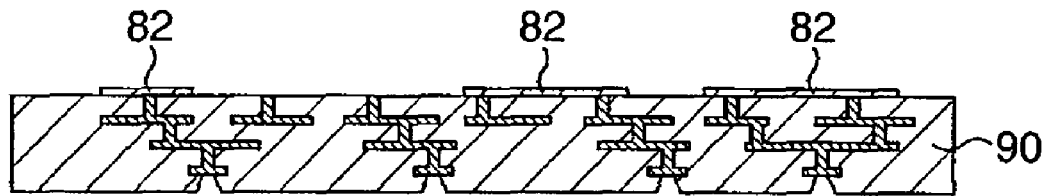

Thereafter, as shown in FIG. 25B, the left copper plate 71 is patterned to form predetermined wirings 82 to finish the film-shaped multilayer wiring thin film 90.

As described above, according to this embodiment, when the multilayer wiring thin film is obtained as a single body by finally removing the supporting base, it is possible to easily perform fine control of thicknesses of respective wiring layers composing the multilayer wiring thin film and remove the copper plate 71 efficiently and easily at low cost, resulting in the realization of the multilayer wiring thin film having a fine wiring structure, for example, with a via diameter approximately between 5 μm and 10 mμ and a L/S between 5 μm/5 μm and 20 μm/20 μm.

Incidentally, in this embodiment and a modification example thereof, the electric conductor substrate (copper plate) is shown as an example of the supporting base, but the supporting base may be composed of an insulating substrate made of resin or the like. In this case, as in this embodiment, after the thickness of the supporting base is made uniform by cutting with a tool, a multilayer wiring thin film is formed by stacking wiring layers while planarizing them and making their thicknesses uniform by cutting, and the supporting base is removed by cutting from its back surface. Also in this cutting, it is suitable to planarize the supporting base leaving any given thickness and use it as an insulating layer.

Moreover, when the flexibility, so-called toughness, of resin to be cut is high as described above, the roughness of a finish surface can be reduced by setting the rake angle of a tool to 5° or more, which is advisable.

INDUSTRIAL APPLICABILITY

According to the present invention, considering that it is mainly directed to machining other than CMP represented by cutting as a planarization method, it becomes possible to make variations in the thickness of a substrate (especially, semiconductor substrate) uniform and realize high-speed planarization easily and inexpensively without disadvantages such as dishing and without any limitation on a wiring design.

Moreover, according to the present invention, when a multilayer wiring thin film is obtained as a single body by finally removing a supporting base, it is possible to easily perform fine control of thicknesses of respective wiring layers composing the multilayer wiring thin film and remove a copper plate efficiently and easily at low cost, resulting in the realization of the multilayer wiring thin film having a fine wiring structure.

What is claimed is:

1. A wiring substrate forming method, comprising:
   a first step of making a thickness of a supporting base uniform by first machining;
   a second step of forming a wiring and an insulating film which covers the wiring on a front surface of the supporting base whose thickness is made uniform;
   a third step of performing planarization processing by second machining in such a manner that a surface of the wiring and a surface of the insulating film become continuously flat to form a wiring layer composed of the wiring and the insulating film; and
   a fourth step of forming a wiring thin film having a uniform thickness which includes the wiring layer by removing the supporting base.

2. The wiring substrate forming method according to claim 1, wherein by repeating a series of steps composed of said second step and said third step plural times while making all of thicknesses of the supporting base and the respective wiring layers uniform in the planarizization processing by the second machining, the wiring thin film having the uniform thickness formed by stacking a plurality of the wiring layers is formed.

3. The wiring substrate forming method according to claim 1, wherein the second machining is cutting with a tool.

4. The wiring substrate forming method according to claim 3, wherein after the cutting, a cutting surface subjected to the planarization processing is traced again with the tool in a same tool position as the planarization processing.

5. The wiring substrate forming method according to claim 1, wherein the first machining is cutting with a tool.

6. The wiring substrate forming method according to claim 1, wherein in said fourth step, the supporting base is removed by being subjected to cutting with a tool from a back surface of the supporting base.

7. The wiring substrate forming method according to claim 6, wherein the supporting base is made of a conductive material.

8. The wiring substrate forming method according to claim 7, wherein chippings produced when the supporting base is cut in said fourth step are collected and used again for formation of the supporting base.

9. The wiring substrate forming method according to claim 8, further comprising, after the supporting base is planarized leaving any given thickness in said fourth step, a fifth step of processing the supporting base left as a conductive layer in any given pattern.

10. A wiring film forming method, comprising:
    a first step of forming a wiring and an insulating film which covers the wiring on a supporting base;
    a second step of performing second machining in such a manner that a surface of the wiring and a surface of the insulating film become continuously flat; and
    a third step of removing the supporting base.

11. The wiring thin film forming method according to claim 10, wherein the supporting base is subjected to first machining before said first step.

12. The wiring thin film forming method according to claim 10, wherein the second machining is cutting with a tool.

* * * * *